(12) United States Patent
Franke et al.

(10) Patent No.: US 11,709,422 B2
(45) Date of Patent: Jul. 25, 2023

(54) GRAY-TONE LITHOGRAPHY FOR PRECISE CONTROL OF GRATING ETCH DEPTH

(71) Applicant: Meta Platforms Technologies, LLC, Menlo Park, CA (US)

(72) Inventors: Elliott Franke, Bellevue, WA (US); Nihar Ranjan Mohanty, Snoqualmie, WA (US); Ankit Vora, Bothell, WA (US); Austin Lane, Sammamish, WA (US); Matthew E. Colburn, Woodinville, WA (US)

(73) Assignee: META PLATFORMS TECHNOLOGIES, LLC, Menlo Park, CA (US)

( * ) Notice: Subject to any disclaimer, the term of this patent is extended or adjusted under 35 U.S.C. 154(b) by 288 days.

(21) Appl. No.: 17/024,081

(22) Filed: Sep. 17, 2020

(65) Prior Publication Data
US 2022/0082936 A1   Mar. 17, 2022

(51) Int. Cl.
*G03F 7/00* (2006.01)
*G03F 7/09* (2006.01)
*G03F 7/11* (2006.01)
*G02B 27/01* (2006.01)
*G03F 7/12* (2006.01)
*F21V 8/00* (2006.01)

(52) U.S. Cl.
CPC ......... *G03F 7/0005* (2013.01); *G02B 6/0016* (2013.01); *G02B 6/0038* (2013.01); *G02B 6/0065* (2013.01); *G02B 27/0172* (2013.01); *G03F 7/091* (2013.01); *G03F 7/11* (2013.01); *G03F 7/12* (2013.01); *G02B 2027/0178* (2013.01)

(58) Field of Classification Search
CPC ...... G03F 7/091; G03F 7/0005; G03F 7/0035; G03F 7/12; G03F 7/11; G02B 6/0038; G02B 6/0016; G02B 2027/0138; G02B 6/00; G02B 2027/012; G02B 2027/0178; G02B 27/0172; G02B 6/0065
USPC ........................................................ 430/266
See application file for complete search history.

(56) References Cited

U.S. PATENT DOCUMENTS 3,914,608 A  10/1975  Malmberg
3,980,883 A   9/1976  Franks
(Continued)

FOREIGN PATENT DOCUMENTS

CA  02214927  * 4/1999  .............. G02B 5/26
CA   2214927    4/1999
(Continued)

OTHER PUBLICATIONS

F L Buzzi et al 2009 Plasma Sources Sci. Technol. 18 025009 (Year: 2009).*
(Continued)

*Primary Examiner* — Pamela H Weiss
*Assistant Examiner* — Andrew Preston Traywick
(74) *Attorney, Agent, or Firm* — Weaver Austin Villeneuve & Sampson LLP

(57) ABSTRACT

Gray-tone lithography techniques for controlling the thickness profile of an overcoat layer on a surface-relief grating that has a non-uniform grating parameter (e.g., depth, duty cycle, or period), compensating for the non-uniform etch rate in a large area, defining etch/block regions, and/or controlling the thickness of the grating layer.

20 Claims, 21 Drawing Sheets

(56) References Cited

U.S. PATENT DOCUMENTS

| | | |
|---|---|---|
| 4,163,155 A | 7/1979 | Alles et al. |
| 5,799,231 A | 8/1998 | Gates et al. |
| 5,876,902 A | 3/1999 | Veneklasen et al. |
| 5,888,698 A | 3/1999 | Koh et al. |
| 6,545,808 B1 | 4/2003 | Ehbets et al. |
| 6,583,933 B2 | 6/2003 | Lamartine |
| 6,602,647 B2 | 8/2003 | Iwasa et al. |
| 6,720,565 B2 | 4/2004 | Innes et al. |
| 6,753,129 B2 | 6/2004 | Livesay et al. |
| 6,812,471 B2 | 11/2004 | Popiolkowski et al. |
| 6,864,590 B2 | 3/2005 | Bae et al. |
| 7,176,471 B2 | 2/2007 | Ito et al. |
| 7,218,449 B2 | 5/2007 | Drenten et al. |
| 7,481,565 B2 | 1/2009 | Yu |
| 7,663,124 B2 | 2/2010 | Kasono et al. |
| 8,168,373 B2 | 5/2012 | Shew |
| 8,614,052 B2 | 12/2013 | Galler |
| 8,749,890 B1 | 6/2014 | Wood et al. |
| 8,975,601 B1 | 3/2015 | Chen |
| 9,372,347 B1 | 6/2016 | Levola et al. |
| 9,378,926 B2 | 6/2016 | Kuo et al. |
| 9,423,360 B1 | 8/2016 | Kostamo et al. |
| 9,535,253 B2 | 1/2017 | Levola et al. |
| 9,690,208 B2 | 6/2017 | Yu |
| 9,715,067 B1 | 7/2017 | Brown et al. |
| 9,827,209 B2 | 11/2017 | Kostamo |
| 9,885,870 B2 | 2/2018 | Stenberg et al. |
| 10,018,844 B2 | 7/2018 | Levola et al. |
| 10,049,892 B2 | 8/2018 | Mohanty et al. |
| 10,067,347 B2 | 9/2018 | Vallius et al. |
| 10,156,725 B2 | 12/2018 | TeKolste et al. |
| 10,216,061 B2 | 2/2019 | Popovich et al. |
| 10,228,621 B2 | 3/2019 | Hatakeyama et al. |
| 10,241,330 B2 | 3/2019 | Popovich et al. |
| 10,254,542 B2 | 4/2019 | Kollin et al. |
| 10,274,823 B2 | 4/2019 | Singh et al. |
| 10,317,677 B2 | 6/2019 | Levola |
| 10,422,934 B2 | 9/2019 | Valera et al. |
| 10,436,958 B2 | 10/2019 | Meili et al. |
| 10,437,064 B2 | 10/2019 | Popovich et al. |
| 10,459,145 B2 | 10/2019 | Popovich et al. |
| 10,527,865 B2 | 1/2020 | Yang et al. |
| 10,534,115 B1 | 1/2020 | Calafiore et al. |
| 10,670,876 B2 | 6/2020 | Popovich et al. |
| 10,795,173 B2 | 10/2020 | Evans et al. |
| 10,823,894 B2 | 11/2020 | Peroz et al. |
| 2001/0028039 A1 | 10/2001 | Plontke et al. |
| 2002/0122015 A1 | 9/2002 | Song et al. |
| 2002/0122255 A1 | 9/2002 | Ogusu et al. |
| 2002/0146627 A1 | 10/2002 | Suleski et al. |
| 2003/0007444 A1 | 1/2003 | Tsukuda et al. |
| 2003/0077039 A1 | 4/2003 | Kurihara et al. |
| 2004/0261282 A1* | 12/2004 | Bae .................. H01L 23/544 |
| | | 33/645 |
| 2005/0035308 A1 | 2/2005 | Javer et al. |
| 2005/0151284 A1 | 7/2005 | Soeno |
| 2005/0202351 A1* | 9/2005 | Houlihan ............ G03F 7/11 |
| | | 430/273.1 |
| 2006/0108542 A1 | 5/2006 | Ito |
| 2006/0110116 A1 | 5/2006 | Sakai et al. |
| 2006/0115745 A1 | 6/2006 | Yasuda |
| 2006/0121396 A1 | 6/2006 | Gauglitz et al. |
| 2006/0124869 A1 | 6/2006 | Yoneyama et al. |
| 2007/0160336 A1 | 7/2007 | Sakai et al. |
| 2008/0026258 A1 | 1/2008 | Okino |
| 2008/0094694 A1 | 4/2008 | Yun et al. |
| 2008/0112670 A1 | 5/2008 | Brooks et al. |
| 2008/0138013 A1 | 6/2008 | Parriaux |
| 2008/0197295 A1 | 8/2008 | Kaule et al. |
| 2008/0237460 A1 | 10/2008 | Fragner et al. |
| 2009/0123870 A1 | 5/2009 | Usa et al. |
| 2009/0128911 A1 | 5/2009 | Itzkovitch et al. |
| 2009/0134340 A1 | 5/2009 | Furuhashi et al. |
| 2009/0166553 A1 | 7/2009 | Okino |
| 2009/0230328 A1 | 9/2009 | Komatsu et al. |
| 2010/0237262 A1 | 9/2010 | Usa et al. |
| 2011/0038049 A1 | 2/2011 | Vallius et al. |
| 2011/0255388 A1 | 10/2011 | Goshima et al. |
| 2013/0027683 A1 | 1/2013 | Yamashita |
| 2013/0051730 A1 | 2/2013 | Travers et al. |
| 2013/0058370 A1 | 3/2013 | Chang-Hasnain et al. |
| 2014/0104665 A1 | 4/2014 | Popovich et al. |
| 2014/0140653 A1 | 5/2014 | Brown et al. |
| 2014/0140654 A1 | 5/2014 | Brown et al. |
| 2014/0204455 A1 | 7/2014 | Popovich et al. |
| 2014/0252228 A1 | 9/2014 | McMorran |
| 2014/0363955 A1* | 12/2014 | Hatakeyama ............ C08G 8/08 |
| 2015/0002528 A1 | 1/2015 | Bohn et al. |
| 2015/0289762 A1 | 10/2015 | Popovich et al. |
| 2015/0344353 A1 | 12/2015 | Han et al. |
| 2016/0035539 A1 | 2/2016 | Sainiemi et al. |
| 2016/0116979 A1 | 4/2016 | Border |
| 2016/0209657 A1 | 7/2016 | Popovich et al. |
| 2016/0329207 A1* | 11/2016 | Mohanty ............ H01L 21/0273 |
| 2017/0243718 A1 | 8/2017 | Motosugi |
| 2017/0307886 A1 | 10/2017 | Stenberg et al. |
| 2017/0307887 A1 | 10/2017 | Stenberg et al. |
| 2018/0052276 A1 | 2/2018 | Klienman et al. |
| 2018/0052501 A1 | 2/2018 | Jones, Jr. et al. |
| 2018/0059297 A1 | 3/2018 | Peroz et al. |
| 2018/0059304 A1 | 3/2018 | Bhargava et al. |
| 2018/0095201 A1 | 4/2018 | Meili et al. |
| 2018/0149791 A1 | 5/2018 | Urness et al. |
| 2018/0188542 A1 | 7/2018 | Waldem et al. |
| 2018/0232048 A1 | 8/2018 | Popovich et al. |
| 2018/0275350 A1 | 9/2018 | Oh et al. |
| 2018/0284440 A1 | 10/2018 | Popovich et al. |
| 2019/0004219 A1 | 1/2019 | Tervo |
| 2019/0041634 A1 | 2/2019 | Popovich et al. |
| 2019/0227316 A1* | 7/2019 | Lee .................. G02B 5/1857 |
| 2019/0324176 A1 | 10/2019 | Colburn et al. |
| 2019/0324202 A1 | 10/2019 | Colburn et al. |
| 2020/0018985 A1* | 1/2020 | Evans ................ G02B 27/0103 |
| 2020/0026074 A1 | 1/2020 | Waldern et al. |
| 2020/0088932 A1 | 3/2020 | Schultz et al. |
| 2020/0142120 A1 | 5/2020 | Meyer Timmerman Thijssen et al. |
| 2020/0209630 A1 | 7/2020 | Schultz et al. |
| 2020/0271850 A1 | 8/2020 | Vora et al. |
| 2020/0278554 A1 | 9/2020 | Schultz et al. |
| 2022/0082739 A1 | 3/2022 | Franke et al. |

FOREIGN PATENT DOCUMENTS

| | | | |
|---|---|---|---|
| EP | 2386841 A1 | 11/2011 | |
| JP | 19675097 | * 2/1992 | ............... G03F 1/08 |
| KR | 20050067860 A | * 12/2003 | ........... G02F 1/1303 |
| WO | 2018220270 A1 | 12/2018 | |
| WO | 2019209422 | 10/2019 | |
| WO | 2019209527 | 10/2019 | |
| WO | 2020176528 A1 | 9/2020 | |

OTHER PUBLICATIONS

Jiekang Chen, Qitai Huang, Min Guan, "The application of diffraction grating in the design of virtual reality (VR) system," Proc. SPIE 10459, AOPC 2017: Optical Storage and Display Technology, 1045909 (Oct. 24, 2017); doi: 10.1117/12.2284100 (Year: 2017).*

MicroChemicals GmbH: Photoresists, Ancillaries, Etchants, Solvents, and Technical Support for all Stages of MicroStructuring and Lithography, Document: (Year: 2017).*

Fowler PD, Ruscher C, McGraw JD, Forrest JA, Dalnoki-Veress K. Controlling Marangoni-induced instabilities in spin-cast polymer films: How to prepare uniform films. Eur Phys J E Soft Matter. Sep. 2016 (Year: 2016).*

Machine Translation of JP19675097 (Miyazaki) (Year: 1999).*

Machine Translation of KR20050067860 (Chui) (Year: 2005).*

Final Office Action dated Dec. 20, 2021 for U.S. Appl. No. 16/437,636, filed Jun. 11, 2019, 19 pages.

International Search Report and Written Opinion for International Application No. PCT/US2021/045043, dated Feb. 3, 2022, 14 pages.

(56) References Cited

OTHER PUBLICATIONS

Invitation to Pay Additional Fees for International Application No. PCT/US2021/045043, dated Dec. 13, 2021, 9 Pages.
Final Office Action dated Mar. 23, 2021 for U.S. Appl. No. 16/437,636, filed Jun. 11, 2019, 16 pages.
Non-Final Office Action dated Aug. 23, 2021 for U.S. Appl. No. 16/437,636, filed Jun. 11, 2019, 16 Pages.
Notice of Allowance dated Sep. 17, 2019 in U.S. Appl. No. 15/713,419.
U.S. Final Office Action dated Jul. 5, 2019 in U.S. Appl. No. 15/713,419.
U.S. Non-Final Office Action dated Mar. 6, 2019 in U.S. Appl. No. 15/713,419.
U.S. Restriction Requirement dated Dec. 18, 2018 in U.S. Appl. No. 15/713,419.
U.S. Restriction Requirement dated Jul. 13, 2020 in U.S. Appl. No. 16/437,636.
U.S. Non-Final Office Action dated Nov. 10, 2020 in U.S. Appl. No. 16/437,636.
U.S. Non-Final Office Action dated Apr. 21, 2020 in U.S. Appl. No. 16/799,532.
U.S. Non-Final Office Action dated Sep. 4, 2020 in U.S. Appl. No. 16/799,532.
U.S. Notice of Allowance dated Dec. 15, 2020 in U.S. Appl. No. 16/799,532.
International Application No. PCT/US2020/019727, International Search Report and Written Opinion dated May 29, 2020, 13 pages.
"New Grayscale Technique Opens a Third Dimension for Nanoscale Lithography", NIST, Available Online at: https://www.nisl.gov/news-events/news/2013/08/new-grayscale-technique-opens-third-dimension-nanoscale-lithography,Aug. 28, 2013, 3 pages.
"Stitch-Free Lithography", Available Online at: https://www.raith.com/lechnology/slilch-free-lithography.html, Accessed from Internet at Feb. 10, 2017, 1 page.
Blazed grating, From Wikipedia, the free encyclopedia, last edited on Dec. 26, 2016, 3 pages. Available Online at: https://en.wikipedia.org/wiki/Blazed_grating.
Chandross, et al., "New Photoresists for Deep Ultraviolet (<300 nm) Exposure", Canadian Journal of Chemistry, vol. 61, 1983, pp. 817-823.
Electron-beam lithography, From Wikipedia, the free encyclopedia, last edited on Sep. 12, 2017, 7 pages. Available Online at: https://en.wikipedia.org/wiki/Electron-beam_lithography.
Grayscale Lithography, Available Online at: http://www.eng.auburn.edu/~sylee/gray.html, 1 page.
Kirchner et al., ZEP520A-A resist for electron-beam grayscale lithography and thermal reflow, Microelectronic Engineering, vol. 153, Mar, 5, 2016, pp. 71-76.
Kristjánsson, Sigurgeir, et al. "Circular grating coupled DBR laser with integrated focusing outcoupler," IEEE Photonics Technology Letters 9.4 (1997): 416-418 (Year: 1997).
Optical Components, retrieved from https://microdevices.jpl.nasa.gov/capabilities/optical-components/process-for-3-d-surface-relief-profiles.php and printed on Feb. 10, 2017.
Steingrüber, et al. (2002). Continuously chirped gratings for DFB-lasers fabricated by direct write electron-beam lithography. Microelectronic engineering, 61, 331-335, (Year: 2002).
Yu, et al., "The evaluation of photo/e-beam complementary grayscale lithography for high topography 3D structure". Proc. SPIE 8682, Advances in Resist Materials and Processing Technology XXX, 868212, retrieved from at: http://proceedings.spiedigitallibrary.org/proceeding.aspx?articleid=1674320, Mar. 29, 2013 and printed on Feb. 10, 2017.
"Functional Materials for inkjet-printing," Microresist Technology, 2021, 3 pages, Retrieved from the Internet: URL: https://www.microresist.de/en/tech-blogs-micro/funktionelle-materialien-fuer-ink-jet-printing-inkormo-und-inkepo/.
Non-Final Office Action dated Jul. 25, 2022 for U.S. Appl. No. 16/437,636, filed Jun. 11, 2019, 24 pages.
Percin G., "Resist Deposition Without Spinning by using Novel Inkjet Technology and Direct Lithography for MEMS," Advances in Resist Technology and Processing XV (SPIE), Jun. 29, 1998, vol. 3333, 8 pages.
Reddington E., "Inkjet Printing for eco-friendly PCB etch Process," Ideas & Innovation, Aug. 11, 2016, 3 pages, Retrieved from the Internet: URL: https://www.dupont.com/electronic-materials/blogs/knowledge/inkjet-printing-for-eco-friendly-pcb-etch-processes.html.

\* cited by examiner

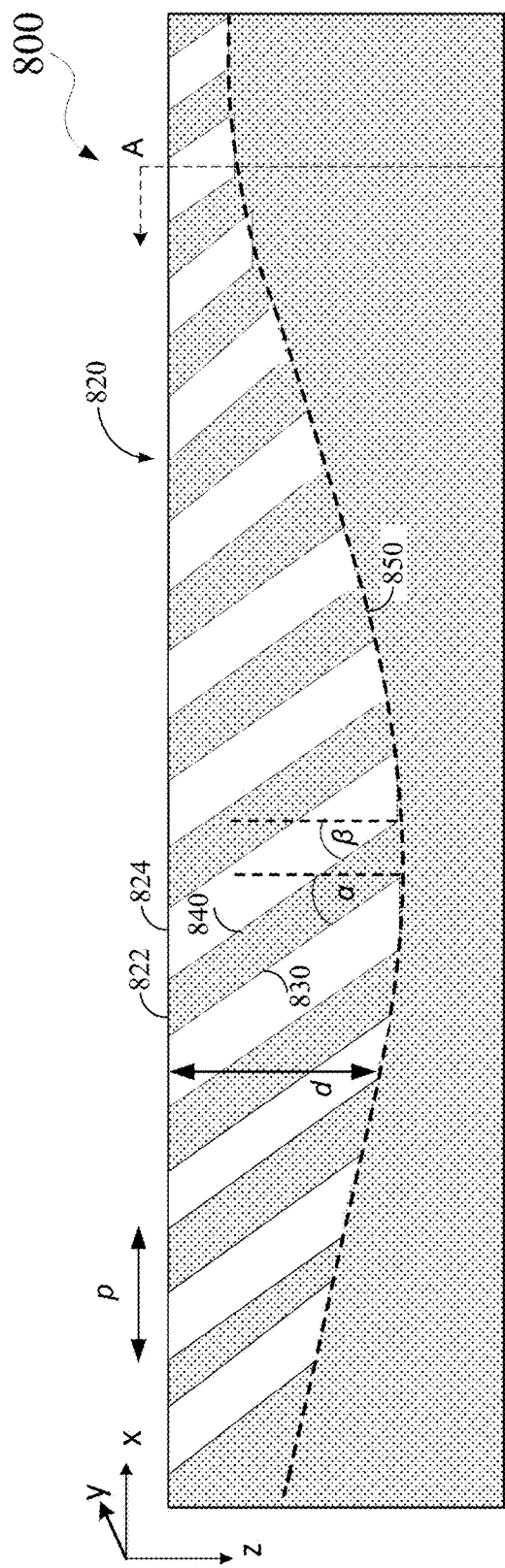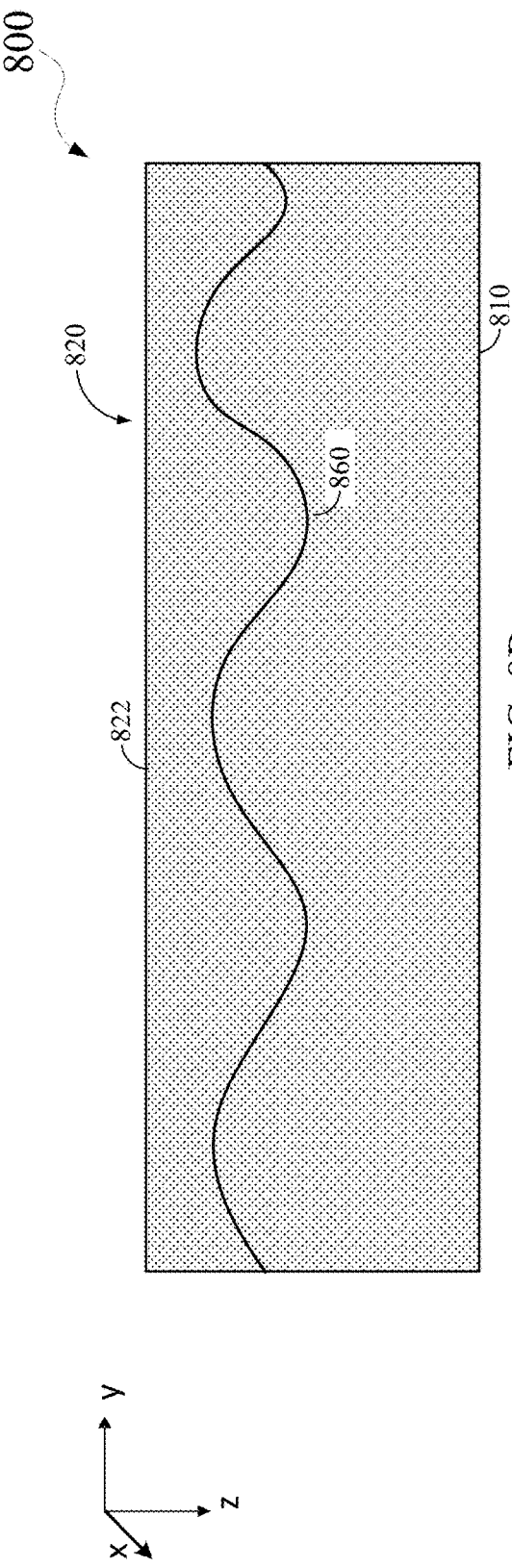
FIG. 8A
FIG. 8B

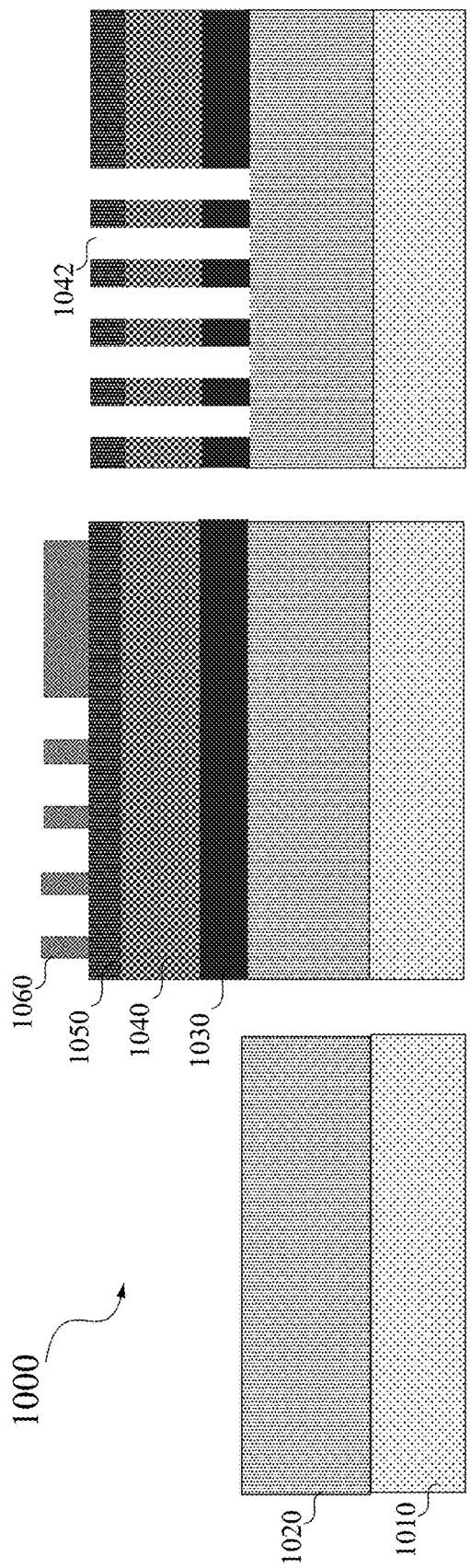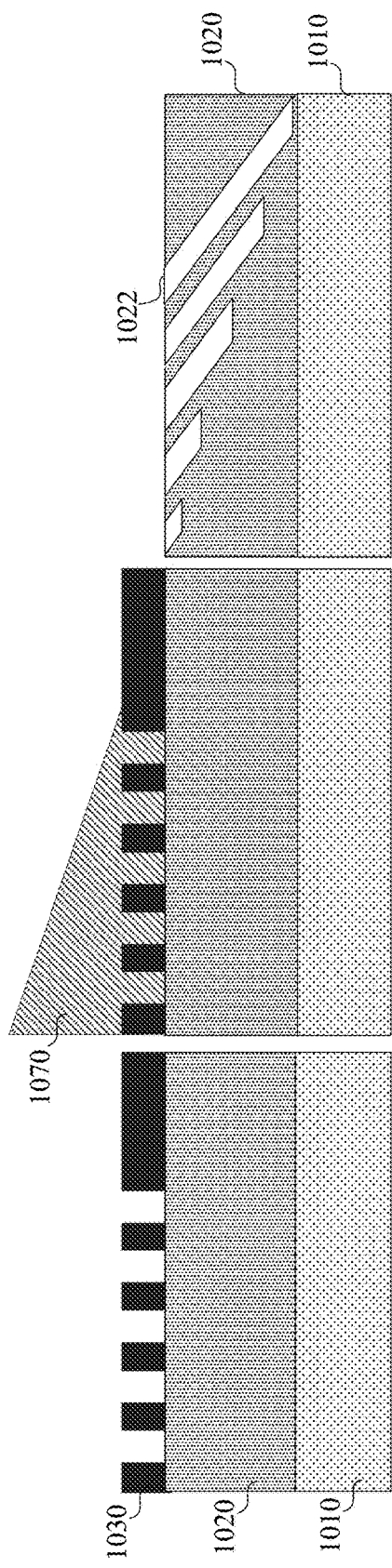

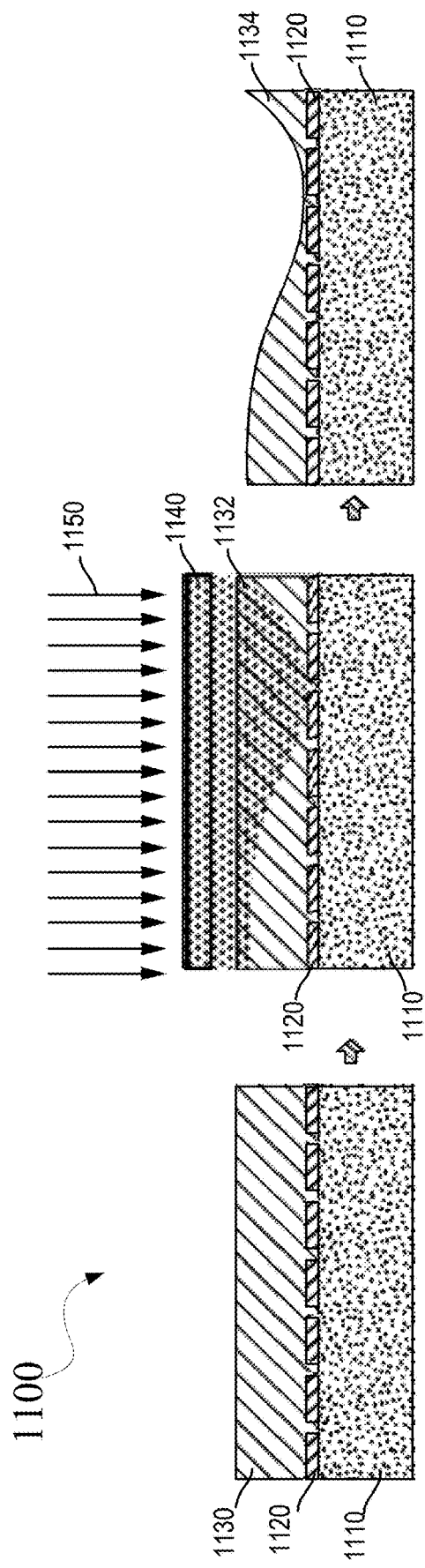

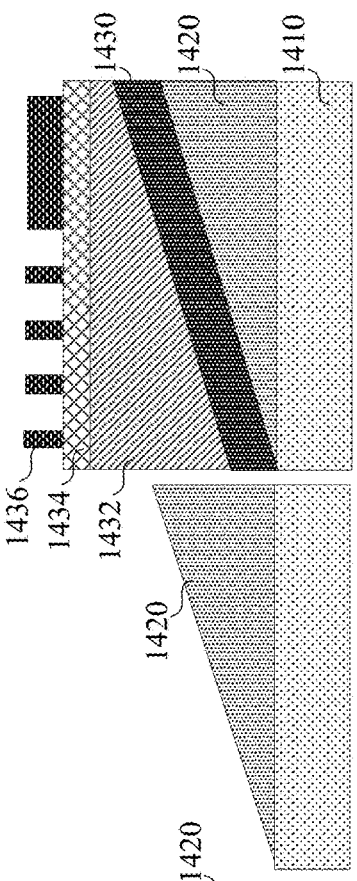
FIG. 14A
FIG. 14B
FIG. 14C
FIG. 14D
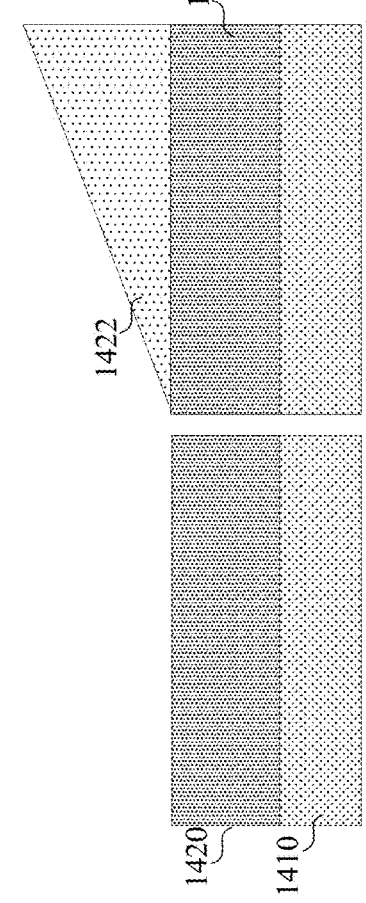
FIG. 14E
FIG. 14F
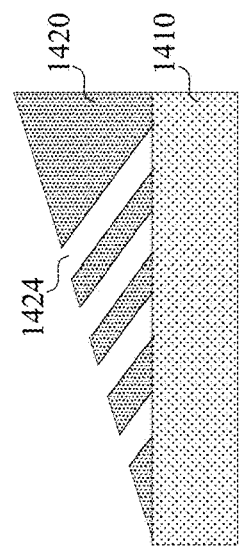
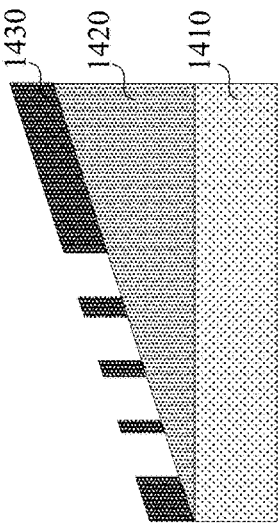
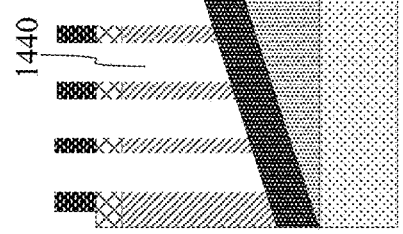
FIG. 14G

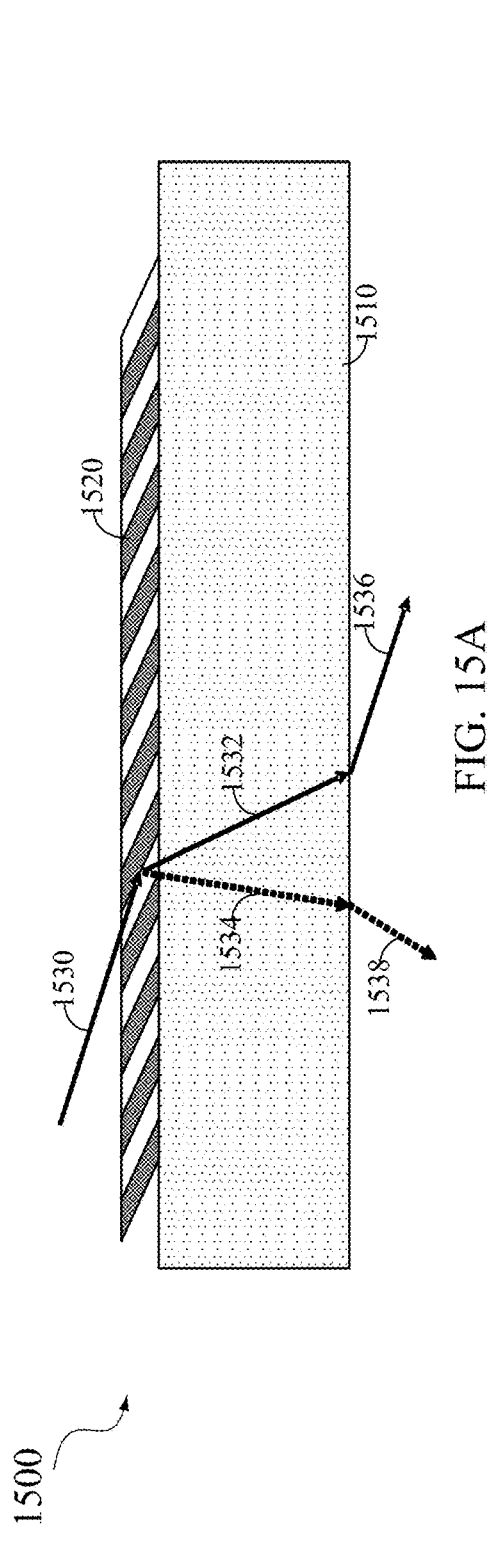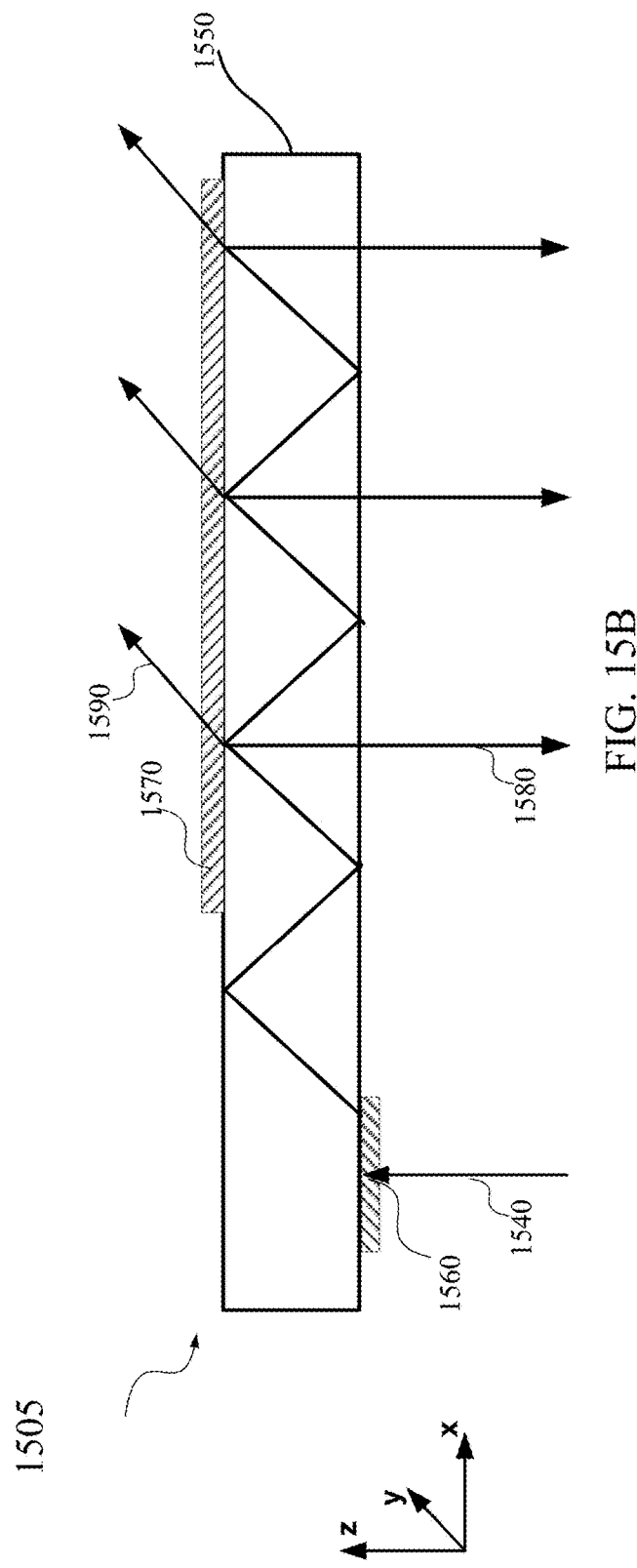
FIG. 15A
FIG. 15B

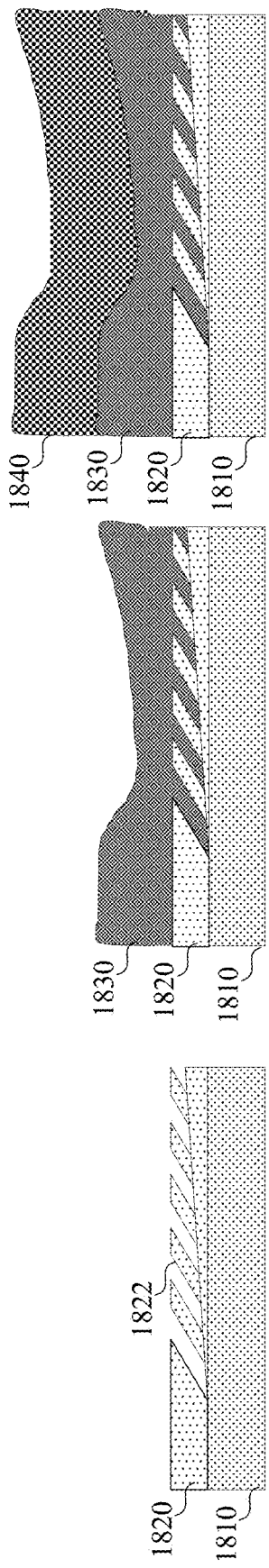
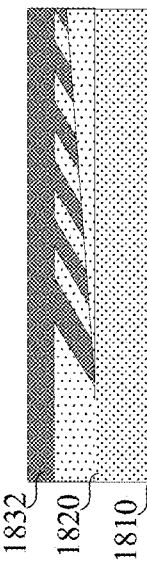
FIG. 18C
FIG. 18B
FIG. 18A
FIG. 18F
FIG. 18E
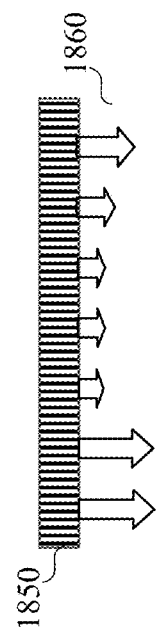
FIG. 18D

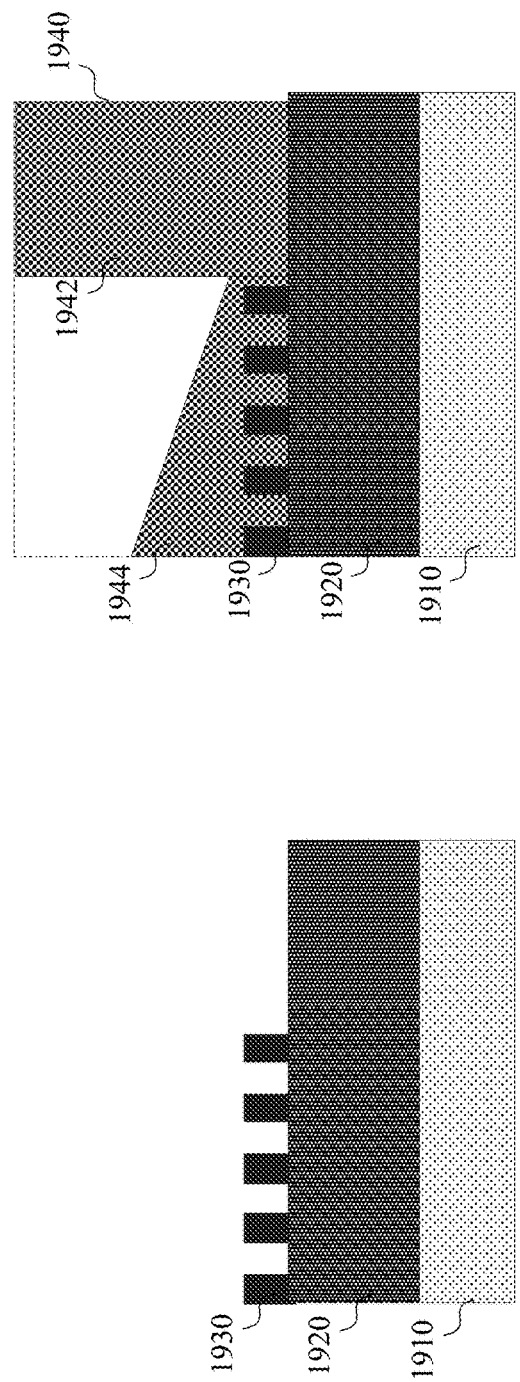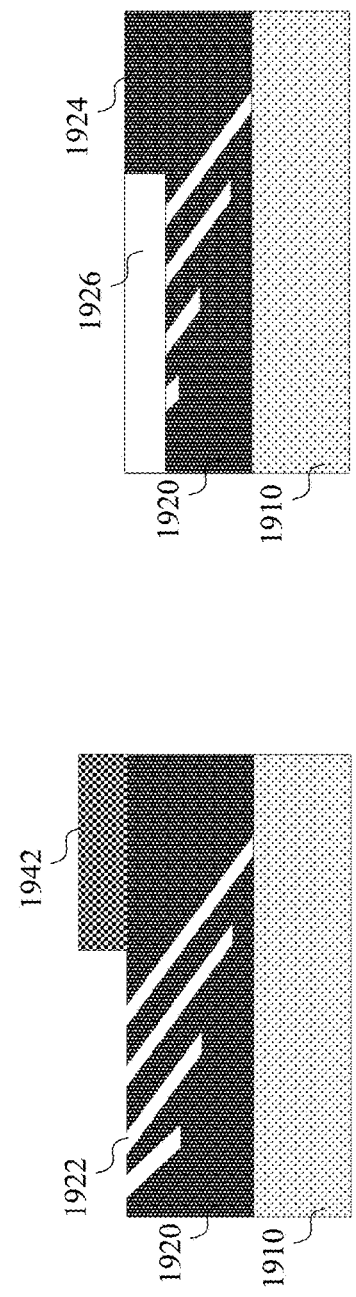
FIG. 19A  FIG. 19B  FIG. 19C  FIG. 19D

GRAY-TONE LITHOGRAPHY FOR PRECISE CONTROL OF GRATING ETCH DEPTH

CROSS-REFERENCES TO RELATED APPLICATIONS

The following two U.S. patent applications listed below (which include the present application) are being filed concurrently, and the entire disclosure of the other application is hereby incorporated by reference into this application for all purposes:

application Ser. No. 17/024,072, filed Sep. 17, 2020, and entitled "TECHNIQUES FOR MANUFACTURING VARIABLE ETCH DEPTH GRATINGS USING GRAY-TONE LITHOGRAPHY"; and application Ser. No. 17/024,081, filed Sep. 17, 2020, and entitled "GRAY-TONE LITHOGRAPHY FOR PRECISE CONTROL OF GRATING ETCH DEPTH".

BACKGROUND

An artificial reality system, such as a head-mounted display (HMD) or heads-up display (HUD) system, generally includes a near-eye display (e.g., in the form of a headset or a pair of glasses) configured to present content to a user via an electronic or optic display in front of the user's eyes. The near-eye display may present virtual objects or combine images of real objects with virtual objects, as in virtual reality (VR), augmented reality (AR), or mixed reality (MR) applications. For example, in an AR system, a user may view both images of virtual objects (e.g., computer-generated images (CGIs)) and the surrounding environment by, for example, seeing through transparent display glasses or lenses (often referred to as optical see-through).

One example of an optical see-through AR system may use a waveguide-based optical display, where the light of projected images may be coupled into a waveguide (e.g., a transparent substrate), propagate within the waveguide, and then be coupled out of the waveguide at different locations. In some optical see-through AR systems, the light of the projected images may be coupled into and out of the waveguide using diffractive optical elements, such as surface-relief gratings or holographic gratings. Light from the surrounding environment may also pass through the diffractive optical elements in a see-through region of the waveguide and reach the user's eyes.

SUMMARY

This disclosure relates generally to surface-relief gratings. More specifically, disclosed herein are techniques for fabricating surface-relief gratings with variable depths and/or other grating parameters (e.g., refractive indices). The surface-relief gratings with variable depths and/or other grating parameters may be used to, for example, reduce optical artifacts in the displayed images and/or the display leakage in optical see-through waveguide displays for augmented reality or mixed reality systems. Various inventive embodiments are described herein, including devices, systems, methods, materials, and the like.

According to certain embodiments, a method may include receiving a substrate including a surface-relief grating formed thereon, depositing an overcoat layer having an uneven top surface on the surface-relief grating, depositing a gray-tone photoresist layer on the overcoat layer, exposing, through a gray-scale photomask, the gray-tone photoresist layer to a light beam having a non-uniform intensity, removing exposed portions of the gray-tone photoresist layer, and etching the gray-tone photoresist layer and the overcoat layer to form a flat top surface on the overcoat layer.

In some embodiments, the surface-relief grating may be characterized by at least one of a variable etch depth, a variable grating period, a variable duty cycle, a variable thickness, or an uneven top surface. In some embodiments, the gray-scale photomask may be characterized by a transmissivity profile corresponding to a height profile of a top surface of the gray-tone photoresist layer. In some embodiments, an etch rate of the gray-tone photoresist layer may be between about 0.5 and about 5 times of an etch rate of the overcoat layer during the etching. In some embodiments, the gray-tone photoresist layer may be characterized by a non-binary response to exposure dosage such that a depth of an exposed portion of the gray-tone photoresist layer is a function of the exposure dosage. The gray-tone photoresist layer may be sensitive to light having a wavelength shorter than about 300 nm, 250 nm, 193 nm, or 157 nm. In some embodiments, the light beam may include an ultraviolet light beam.

In some embodiments, the method may also include forming an anti-reflection coating layer or an angular selective transmission layer on the overcoat layer. In some embodiments, etching the gray-tone photoresist layer and the overcoat layer may include etching the gray-tone photoresist layer and the overcoat layer using at least one of an oxygen source including $O_2$, $N_2O$, $CO_2$, or $CO$; a nitrogen source including $N_2$, $N_2O$, or $NH_3$; or ions with an energy between about 100 and about 500 eV.

According to certain embodiments, a method may include depositing a grating material layer on a substrate, forming a patterned hard mask on a first area of the grating material layer, depositing a photoresist material layer that is sensitive to exposure light and has a non-binary response to exposure dosage on the patterned hard mask and a second area of the grating material layer, exposing the photoresist material layer on the patterned hard mask to a light beam having a non-uniform light intensity for a period of time, developing the photoresist material layer to remove portions of the photoresist material layer exposed to the light beam, etching the photoresist material layer and the grating material layer to form a grating with a variable depth in the grating material layer (where a portion of the photoresist material layer remains on the second area of the grating material layer), removing the patterned hard mask, and etching the first area of the grating material layer and the portion of the photoresist material layer on the second area of the grating material layer.

In some embodiments of the method, an etch rate of the photoresist material layer may be between about 0.5 and about 5 times of an etch rate of the grating material layer. In some embodiments, the light beam may include an ultraviolet light beam. In some embodiments, the method may further include exposing the photoresist material layer on the second area of the grating material layer to a light pattern corresponding to an alignment mark, where etching the first area of the grating material layer and the photoresist material layer on the second area of the grating material layer may form the alignment mark in the second area of the grating material layer. In some embodiments, the method may further include, after developing the photoresist material layer, curing the photoresist material layer using heat or ultraviolet light. In some embodiments, etching the photoresist material layer and the grating material layer may include etching the photoresist material layer and the grating material layer using at least one of an oxygen source including $O_2$, $N_2O$, $CO_2$, or $CO$; a nitrogen source including $N_2$, $N_2O$, or $NH_3$; or ions with an energy between about 100 and about 500 eV.

According to certain embodiments, a method may include depositing a gray-tone photoresist layer on a material layer to be etched by an etching system that is characterized by an uneven etch rate in an etch area; exposing, through a gray-scale photomask, the gray-tone photoresist layer to a light beam having a non-uniform intensity, where a transmissivity of the gray-scale photomask is determined based on the uneven etch rate of the etching system; developing the gray-tone photoresist layer to remove exposed portions of the gray-tone photoresist layer, where remaining portions of the gray-tone photoresist layer have an uneven top surface; and etching the remaining portions of the gray-tone photoresist layer and the material layer to be etched for a period of time.

In some embodiments of the method, an etch rate of the gray-tone photoresist layer may be between about 0.5 and about 5 times of an etch rate of the material layer to be etched. In some embodiments, the light beam may include an ultraviolet beam. In some embodiments, the method may further include, after developing the gray-tone photoresist layer, curing the gray-tone photoresist layer. In some embodiments, the transmissivity of the gray-scale photomask may be complementary to the uneven etch rate of the etching system.

In one embodiment, a waveguide display may include grating couplers that may diffractively couple display light into or out of a waveguide and refractively transmit ambient light through the waveguide. Each of the grating couplers may include two or more grating layers having different respective refractive indices and/or thickness profiles to reduce the coupling of display light out of the waveguide display towards the ambient environment.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

FIG. 8A illustrates a cross-section of an example of a slanted grating with variable etch depths according to certain embodiments.

FIG. 8B illustrates another cross-section of the example of the slanted grating with variable etch depths shown in FIG. 8A according to certain embodiments.

FIGS. 10A-10F illustrate an example of a process for manufacturing a grating with a variable grating depth according to certain embodiments.

FIGS. 11A-11C illustrate an example of a process for forming an etch mask having a desired thickness profile using a gray-scale photomask according to certain embodiments.

FIGS. 14A-14G illustrate an example of a process for manufacturing a grating with a variable depth according to certain embodiments.

FIG. 15A illustrates an example of a waveguide display that may generate optical artifacts due to the diffraction of ambient light.

FIG. 15B illustrates an example of a waveguide display that may leak display light into the ambient environment.

FIGS. 18A-18F illustrate an example of a process for manufacturing a grating with a variable grating depth and an overcoat layer having a flat top according to certain embodiments.

FIG. 19A-19D illustrate an example of a method of controlling the height profile of a grating using gray-tone lithography according to certain embodiments.

Figure 1:
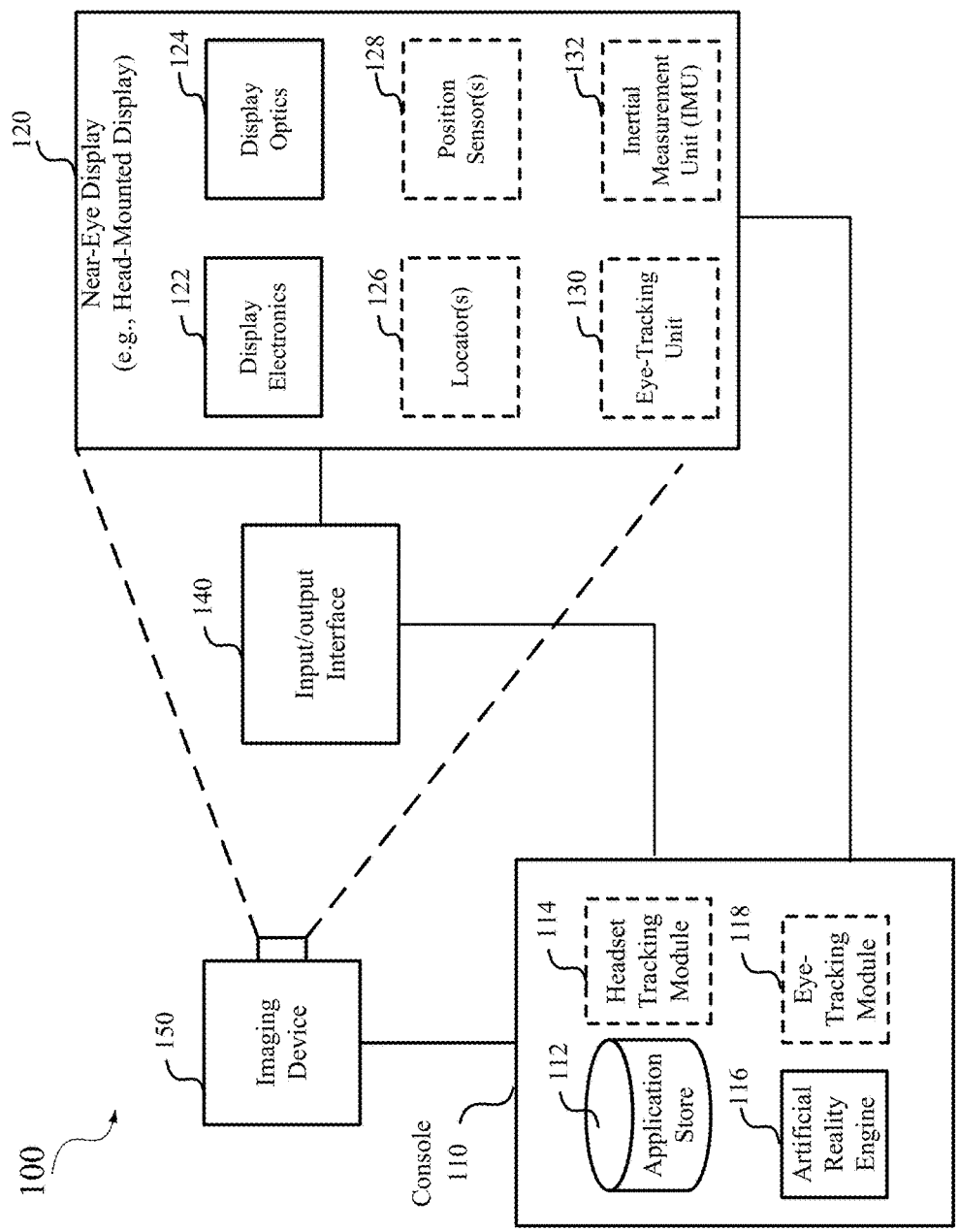
FIG. 1 is a simplified block diagram of an example of an artificial reality system environment including a near-eye display according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Techniques disclosed herein relate generally to surface-relief gratings for optical systems, such as artificial reality systems. More specifically, disclosed herein are techniques for fabricating surface-relief gratings with desired depth profiles and other grating parameters. The surface-relief gratings with the desired depth profiles and/or other grating parameters may be used to, for example, improve efficiencies, improve fields of view, reduce optical artifacts in the displayed images, and/or reduce the display leakage in optical see-through waveguide displays for augmented reality (AR) or mixed reality (MR) applications. Various inventive embodiments are described herein, including devices, systems, methods, materials, processes, and the like.

In an optical see-through waveguide display system, display light from a light source may be coupled into a waveguide using an input grating coupler, and may then be coupled out of the waveguide using output grating couplers for delivering to user's eyes. The waveguide and the grating couplers may be transparent to visible light such that the user can also view the ambient environment through the waveguide display. In order to improve power efficiency, image quality, security, and privacy, non-uniform grating couplers may be used. The non-uniform grating couplers may include, for example, surface-relief gratings that have variable grating periods, etch depths, duty cycles, slant angles, refractive indies, and/or materials. Non-uniform grating couplers with variable grating parameters may offer more degrees of freedom for tuning the gratings to achieve the desired performance. However, it can be very challenging to fabricate such non-uniform grating couplers, such as slanted surface-relief gratings with variable etch depths and/or variable refractive indices.

According to certain embodiments, variable etch depth (VED) gratings may be etched in a material layer (e.g., a film or a substrate) with a uniform thickness using a gray-tone-last process. The gray-tone-last process may include forming a patterned hard etch mask on the material layer to be etched, forming a gray-tone etch mask with a desire height profile (e.g., with a variable thickness) using gray-tone lithography, and then transferring the thickness profile of the gray-tone etch mask to the material layer by etching both the gray-tone etch mask and the underlying material layer. The gray-tone etch mask may be formed from a gray-tone photoresist layer by exposing the gray-tone photoresist layer to a non-uniform light beam using a gray-scale photomask and then removing the exposed portions of the gray-tone photoresist layer in a development process. The gray-tone photoresist layer may have a linear or other non-binary response to the exposure dosage such that the depth of the exposed portion of the gray-tone photoresist layer in a region may be a function of the exposure dosage in the region. The gray-tone etch mask may have an etch rate similar or comparable to the etch rate of the material layer such that the thickness profile of the gray-tone etch mask may be transferred to the underlying material layer.

According to some embodiments, a gray-tone-first process may be used alone or in combination with the gray-tone-last process to fabricate gratings with variable grating parameters. The gray-tone-first process may include performing a gray-tone lithography process to form a film with a desired non-uniform thickness profile on a substrate, forming a hard mask on the film with the non-uniform thickness profile, and etching the film using the hard mask to form a VED grating in the film with the non-uniform thickness profile. The hard mask may be formed by depositing a hard mask material layer (e.g., a metal or metal alloy material, such as Cr) and a tri-layer mask on the film with the non-uniform thickness profile. The tri-layer mask may be used to pattern the hard mask material layer and may include, for example, an organic dielectric layer at the bottom, an anti-reflection coating layer in the middle, and a photoresist layer at the top. The photoresist layer may be patterned and used as a mask for dry or wet etching to form a pattern in the hard mask material layer. The patterned hard mask material layer may then be used as the hard mask for etching the film.

In some embodiments, a bottom anti-reflection coating (BARC) layer and/or a top anti-reflection coating (TARC) layer may be used during the photolithography to reduce light reflection and improve the resolution and quality of the patterns.

According to certain embodiments, VED gratings including multiple layers of different materials having different refractive indices and non-uniform thicknesses may be fabricated using techniques disclosed herein to improve the efficiencies, reduce certain optical artifacts, and/or undesired optical leakage that may cause interference, privacy, and/or security issues in a see-through waveguide display. For example, a waveguide display may include both surface-relief gratings made by the gray-tone-first process and surface-relief gratings made by the gray-one-last process. The input and output grating couplers may be made using different processes.

According to certain embodiments, gray-tone lithography may also be used to control the thickness profile of an overcoat layer on a surface-relief grating that has a non-uniform grating parameter (e.g., depth, duty cycle, or period), to compensate for the non-uniform etch rate in a large area, and/or to define etch/block regions or control the thickness of the grating layer.

For example, a slanted surface-relief grating coupler may include a slanted VED grating and an overcoat layer above the slanted VED grating. In some embodiments, the slanted surface-relief grating coupler may also include a selective transmission structure or anti-reflection structure above the overcoat layer, for example, for optical artifact reduction. The slanted VED grating may be fabricated using the gray-tone-first process and/or the gray-tone-last process disclosed herein. The overcoat layer may be deposited on the slanted VED grating. Due to the variable etch depth of the slanted VED grating, the overcoat layer formed on the slanted VED gratings using existing techniques may have an uneven top surface. For example, spin-on techniques may offer a relatively low-cost and fast way of forming the overcoat layer above the slanted VED grating. But the top surface of the overcoat layer may not be even because the spin-on material may follow the topography of the underlying slanted VED grating, which may have varying slant angles, duty cycles, depths, and the like. Chemical-mechanical polishing (CM)) may be used to achieve a flat top surface on the grating, but may not precisely control the thickness of the overcoat layer on top of the slanted VED grating (referred to as overcoat burden).

According to some embodiments, an overcoat layer may be formed on a grating using, for example, the spin-on technique. A gray-tone photoresist layer may be coated on the overcoat layer using, for example, the spin-on technique. A gray-tone lithography process may then be performed using a gray-tone mask with the light transmissivity mirroring the overcoat layer topography to create a planar top surface on the gray-tone photoresist layer after the exposure and development. The gray-tone photoresist layer may have an etch rate similar or comparable to an etch rate of the overcoat layer such that the gray-tone photoresist layer and the underlying overcoat layer may be etched to leave a flat top surface on the overcoat layer. The etching rate and etch time may be controlled to control the thickness of the overcoat burden.

According to certain embodiments, gray-tone lithography may be used to compensate for the non-uniform etch rate in a large area. A photoresist layer with a non-uniform thickness may be formed on a film or substrate using the gray-tone lithography and a gray-scale photomask having a transmissivity complementary to the non-uniform etch rate. The photoresist layer in an area with a higher etch rate may have a higher thickness, while the photoresist layer in an area with a lower etch rate may have a lower thickness. The combination of the non-uniform thickness of the photoresist layer and the non-uniform etch rate in the etch area may resulted in a uniform effective etch rate of the a film or substrate.

According to certain embodiments, gray-tone lithography may be used to define the etch/block region or control the thicknesses in different regions of a grating. For example, a thick photoresist layer may be formed in regions where etching is not needed to block the regions from being etched.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a simplified block diagram of an example of an artificial reality system environment 100 including a near-eye display 120 in accordance with certain embodiments. Artificial reality system environment 100 shown in FIG. 1 may include near-eye display 120, an optional external imaging device 150, and an optional input/output interface 140, each of which may be coupled to an optional console 110. While FIG. 1 shows an example of artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In some configurations, artificial reality system environment 100 may not include external imaging device 150, optional input/output interface 140, and optional console 110. In alternative configurations, different or additional components may be included in artificial reality system environment 100.

Near-eye display 120 may be a head-mounted display that presents content to a user. Examples of content presented by near-eye display 120 include one or more of images, videos, audio, or any combination thereof. In some embodiments, audio may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form-factor, including a pair of glasses. Some embodiments of near-eye display 120 are further described below with respect to FIGS. 2 and 3. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of eye-tracking unit 130, locators 126, position sensors 128, and IMU 132, or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light emitting diode (OLED) display, an inorganic light emitting diode (ILED) display, a micro light emitting diode (μLED) display, an active-matrix OLED display (AMOLED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. The amount of magnification of image light by display optics 124 may be changed by adjusting, adding, or removing optical elements from display optics 124. In some embodiments, display optics 124 may project displayed images to one or more image planes that may be further away from the user's eyes than near-eye display 120.

Display optics 124 may also be designed to correct one or more types of optical errors, such as two-dimensional optical errors, three-dimensional optical errors, or any combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator 126 may be a light emitting diode (LED), a corner cube reflector, a reflective marker, a type of light source that contrasts with an environment in which near-eye display 120 operates, or any combination thereof. In embodiments where locators 126 are active components (e.g., LEDs or other types of light emitting devices), locators 126 may emit light in the visible band (e.g., about 380 nm to 750 nm), in the infrared (IR) band (e.g., about 750 nm to 1 mm), in the ultraviolet band (e.g., about 10 nm to about 380 nm), in another portion of the electromagnetic spectrum, or in any combination of portions of the electromagnetic spectrum.

External imaging device 150 may include one or more cameras, one or more video cameras, any other device capable of capturing images including one or more of locators 126, or any combination thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or any combination thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or any combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system. For example, eye-tracking unit 130 may include a non-coherent or coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or any combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140. In some embodiments, external imaging device 150 may be used to track input/output interface 140, such as tracking the location or position of a controller (which may include, for example, an IR light source) or a hand of the user to determine the motion of the user. In some embodiments, near-eye display 120 may include one or more imaging devices to track input/output interface 140, such as tracking the location or position of a controller or a hand of the user to determine the motion of the user.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, an artificial reality engine 116, and an eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or any combination thereof, to predict a future location of near-eye display 120. Headset tracking module 114 may provide the estimated or predicted future position of near-eye display 120 to artificial reality engine 116.

Artificial reality engine 116 may execute applications within artificial reality system environment 100 and receive position information of near-eye display 120, acceleration information of near-eye display 120, velocity information of near-eye display 120, predicted future positions of near-eye display 120, or any combination thereof from headset tracking module 114. Artificial reality engine 116 may also receive estimated eye position and orientation information from eye-tracking module 118. Based on the received information, artificial reality engine 116 may determine content to provide to near-eye display 120 for presentation to the user. For example, if the received information indicates that the user has looked to the left, artificial reality engine 116 may generate content for near-eye display 120 that mirrors the user's eye movement in a virtual environment. Additionally, artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to more accurately determine the eye's orientation.

Figure 2:
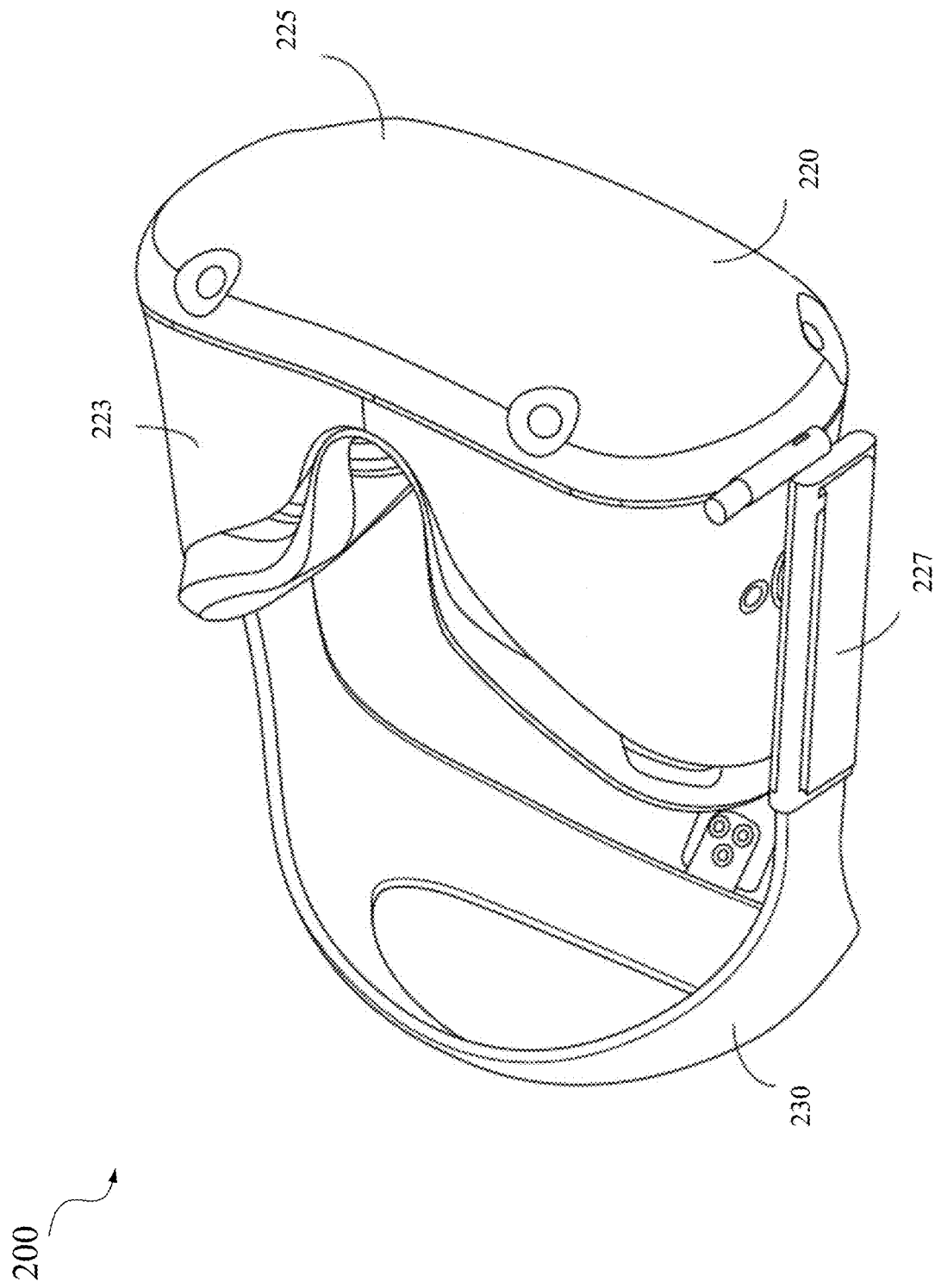
FIG. 2 is a perspective view of an example of a near-eye display in the form of a head-mounted display device for implementing some of the examples disclosed herein.

FIG. 2 is a perspective view of an example of a near-eye display in the form of an HMD device 200 for implementing some of the examples disclosed herein. HMD device 200 may be a part of, e.g., a VR system, an AR system, an MR system, or any combination thereof. HMD device 200 may include a body 220 and a head strap 230. FIG. 2 shows a bottom side 223, a front side 225, and a left side 227 of body 220 in the perspective view. Head strap 230 may have an adjustable or extendible length. There may be a sufficient space between body 220 and head strap 230 of HMD device 200 for allowing a user to mount HMD device 200 onto the user's head. In various embodiments, HMD device 200 may include additional, fewer, or different components. For example, in some embodiments, HMD device 200 may include eyeglass temples and temple tips as shown in, for example, FIG. 3 below, rather than head strap 230.

HMD device 200 may present to a user media including virtual and/or augmented views of a physical, real-world environment with computer-generated elements. Examples of the media presented by HMD device 200 may include images (e.g., two-dimensional (2D) or three-dimensional (3D) images), videos (e.g., 2D or 3D videos), audio, or any combination thereof. The images and videos may be presented to each eye of the user by one or more display assemblies (not shown in FIG. 2) enclosed in body 220 of HMD device 200. In various embodiments, the one or more display assemblies may include a single electronic display panel or multiple electronic display panels (e.g., one display panel for each eye of the user). Examples of the electronic display panel(s) may include, for example, an LCD, an OLED display, an ILED display, a μLED display, an AMO-LED, a TOLED, some other display, or any combination thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. In some implementations, HMD device 200 may include an input/output interface for communicating with a console. In some implementations, HMD device 200 may include a virtual reality engine (not shown) that can execute applications within HMD device 200 and receive depth information, position information, acceleration information, velocity information, predicted future positions, or any combination thereof of HMD device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 220 relative to one another and relative to a reference point. Each of the locators may emit light that is detectable by an external imaging device.

Figure 3:
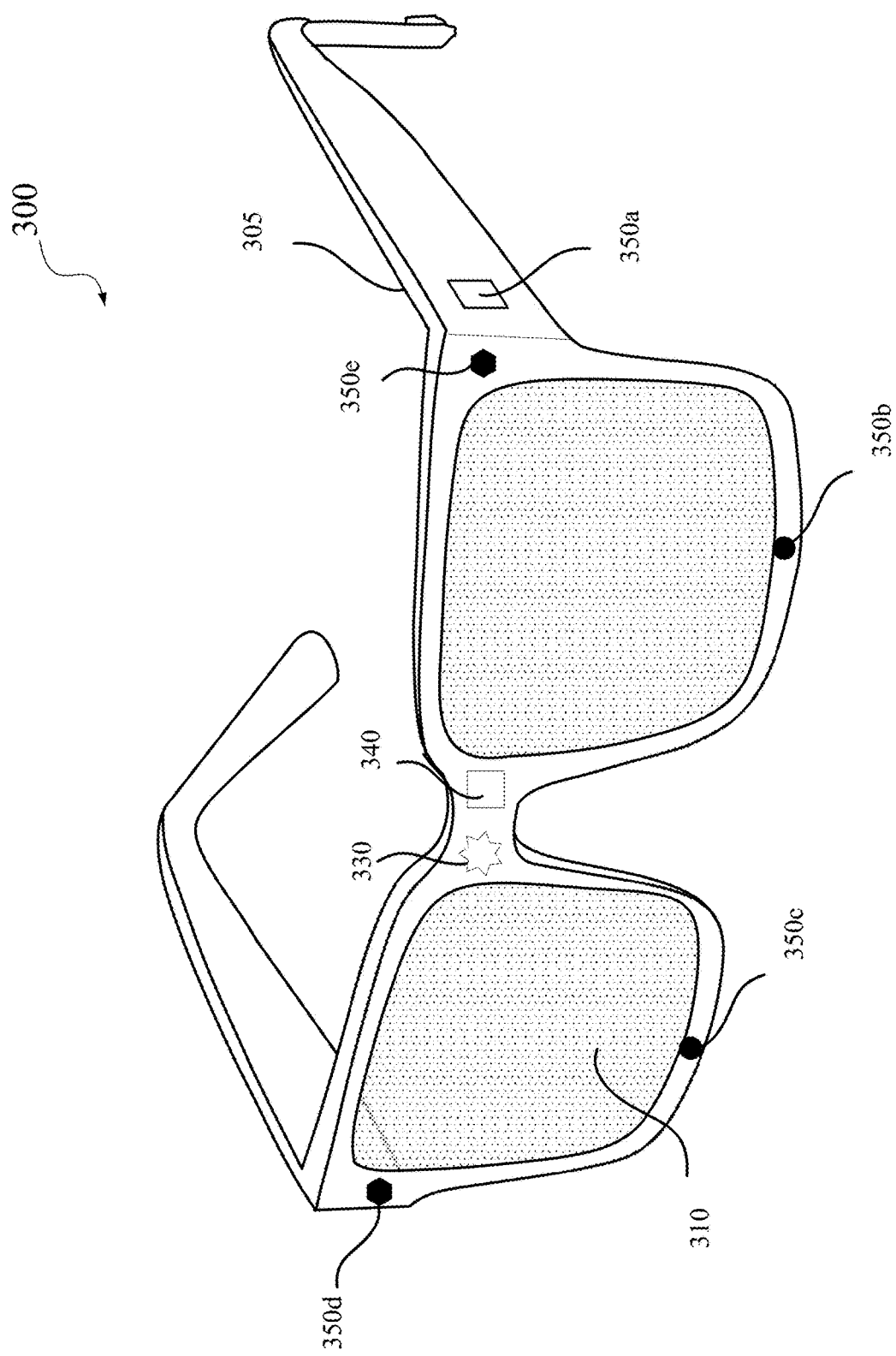
FIG. 3 is a perspective view of an example of a near-eye display in the form of a pair of glasses for implementing some of the examples disclosed herein.

FIG. 3 is a perspective view of an example of a near-eye display 300 in the form of a pair of glasses for implementing some of the examples disclosed herein. Near-eye display 300 may be a specific implementation of near-eye display 120 of FIG. 1, and may be configured to operate as a virtual reality display, an augmented reality display, and/or a mixed reality display. Near-eye display 300 may include a frame 305 and a display 310. Display 310 may be configured to present content to a user. In some embodiments, display 310 may include display electronics and/or display optics. For example, as described above with respect to near-eye display 120 of FIG. 1, display 310 may include an LCD display panel, an LED display panel, or an optical display panel (e.g., a waveguide display assembly).

Near-eye display 300 may further include various sensors 350a, 350b, 350c, 350d, and 350e on or within frame 305. In some embodiments, sensors 350a-350e may include one or more depth sensors, motion sensors, position sensors, inertial sensors, or ambient light sensors. In some embodiments, sensors 350a-350e may include one or more image sensors configured to generate image data representing different fields of views in different directions. In some embodiments, sensors 350a-350e may be used as input devices to control or influence the displayed content of near-eye display 300, and/or to provide an interactive VR/AR/MR experience to a user of near-eye display 300. In some embodiments, sensors 350a-350e may also be used for stereoscopic imaging.

In some embodiments, near-eye display 300 may further include one or more illuminators 330 to project light into the physical environment. The projected light may be associated with different frequency bands (e.g., visible light, infra-red light, ultra-violet light, etc.), and may serve various purposes. For example, illuminator(s) 330 may project light in a dark environment (or in an environment with low intensity of infra-red light, ultra-violet light, etc.) to assist sensors 350a-350e in capturing images of different objects within the dark environment. In some embodiments, illuminator(s) 330 may be used to project certain light patterns onto the objects within the environment. In some embodiments, illuminator(s) 330 may be used as locators, such as locators 126 described above with respect to FIG. 1.

In some embodiments, near-eye display 300 may also include a high-resolution camera 340. Camera 340 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 310 for AR or MR applications.

Figure 4:
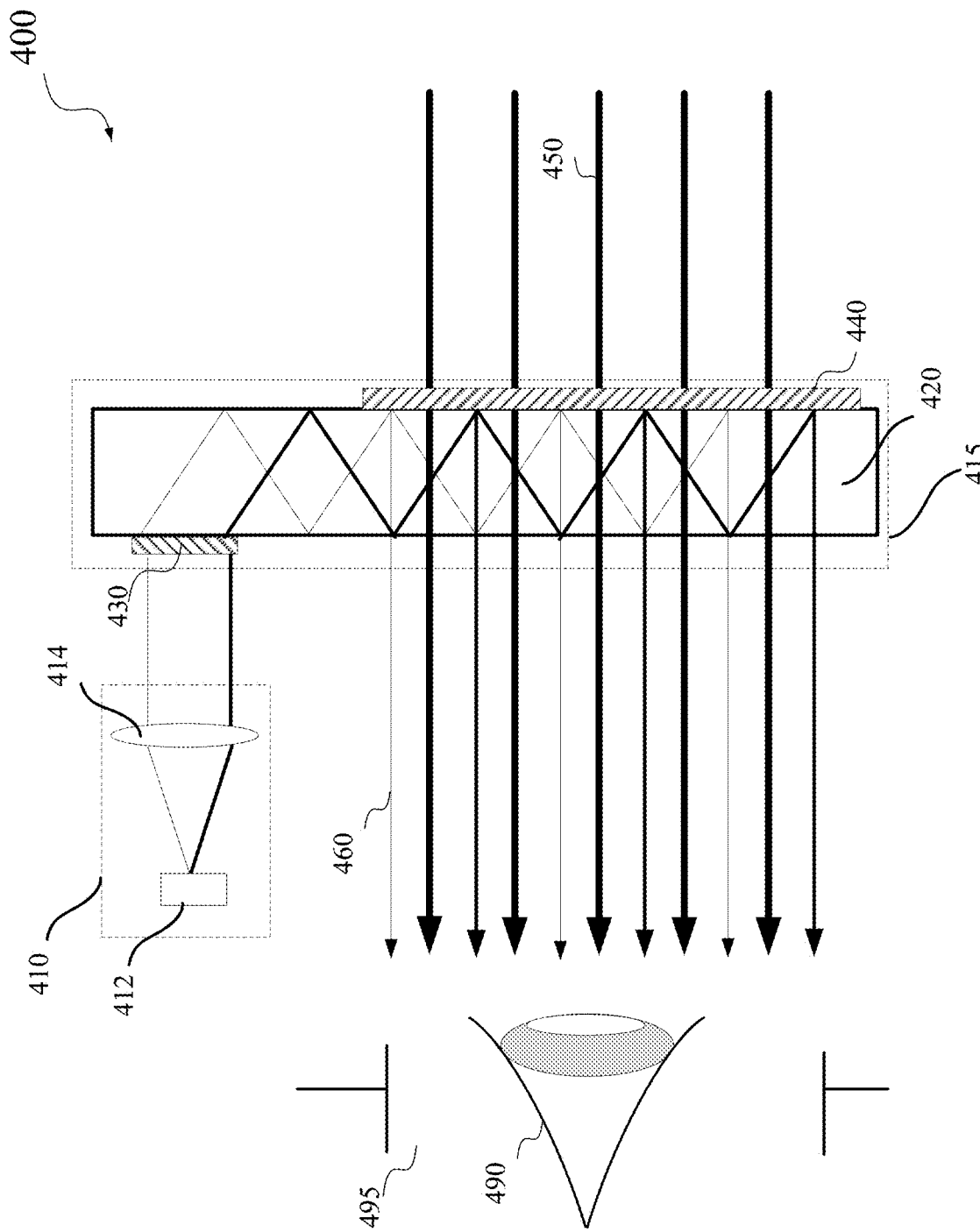
FIG. 4 illustrates an example of an optical see-through augmented reality system including a waveguide display according to certain embodiments.

FIG. 4 illustrates an example of an optical see-through augmented reality system 400 including a waveguide display according to certain embodiments. Augmented reality system 400 may include a projector 410 and a combiner 415. Projector 410 may include a light source or image source 412 and projector optics 414. In some embodiments, light source or image source 412 may include one or more micro-LED devices described above. In some embodiments, image source 412 may include a plurality of pixels that displays virtual objects, such as an LCD display panel or an LED display panel. In some embodiments, image source 412 may include a light source that generates coherent or partially coherent light. For example, image source 412 may include a laser diode, a vertical cavity surface emitting laser, an LED, and/or a micro-LED described above. In some embodiments, image source 412 may include a plurality of light sources (e.g., an array of micro-LEDs described above), each emitting a monochromatic image light corresponding to a primary color (e.g., red, green, or blue). In some embodiments, image source 412 may include three two-dimensional arrays of micro-LEDs, where each two-dimensional array of micro-LEDs may include micro-LEDs configured to emit light of a primary color (e.g., red, green, or blue). In some embodiments, image source 412 may include an optical pattern generator, such as a spatial light modulator. Projector optics 414 may include one or more optical components that can condition the light from image source 412, such as expanding, collimating, scanning, or projecting light from image source 412 to combiner 415. The one or more optical components may include, for example, one or more lenses, liquid lenses, mirrors, apertures, and/or gratings. For example, in some embodiments, image source 412 may include one or more one-dimensional arrays or elongated two-dimensional arrays of micro-LEDs, and projector optics 414 may include one or more one-dimensional scanners (e.g., micro-mirrors or prisms) configured to scan the one-dimensional arrays or elongated two-dimensional arrays of micro-LEDs to generate image frames. In some embodiments, projector optics 414 may include a liquid lens (e.g., a liquid crystal lens) with a plurality of electrodes that allows scanning of the light from image source 412.

Combiner 415 may include an input coupler 430 for coupling light from projector 410 into a substrate 420 of combiner 415. Combiner 415 may transmit at least 50% of light in a first wavelength range and reflect at least 25% of light in a second wavelength range. For example, the first wavelength range may be visible light from about 400 nm to about 650 nm, and the second wavelength range may be in the infrared band, for example, from about 800 nm to about 1000 nm. Input coupler 430 may include a volume holographic grating, a diffractive optical element (DOE) (e.g., a surface-relief grating), a slanted surface of substrate 420, or a refractive coupler (e.g., a wedge or a prism). For example, input coupler 430 may include a reflective volume Bragg grating or a transmissive volume Bragg grating. Input coupler 430 may have a coupling efficiency of greater than 30%, 50%, 75%, 90%, or higher for visible light. Light coupled into substrate 420 may propagate within substrate 420 through, for example, total internal reflection (TIR). Substrate 420 may be in the form of a lens of a pair of eyeglasses. Substrate 420 may have a flat or a curved surface, and may include one or more types of dielectric materials, such as glass, quartz, plastic, polymer, poly(methyl methacrylate) (PMMA), crystal, or ceramic. A thickness of the substrate may range from, for example, less than about 1 mm to about 10 mm or more. Substrate 420 may be transparent to visible light.

Substrate 420 may include or may be coupled to a plurality of output couplers 440, each configured to extract at least a portion of the light guided by and propagating within substrate 420 from substrate 420, and direct extracted light 460 to an eyebox 495 where an eye 490 of the user of augmented reality system 400 may be located when augmented reality system 400 is in use. The plurality of output couplers 440 may replicate the exit pupil to increase the size of eyebox 495 such that the displayed image is visible in a larger area. As input coupler 430, output couplers 440 may include grating couplers (e.g., volume holographic gratings or surface-relief gratings), other diffraction optical elements, prisms, etc. For example, output couplers 440 may include reflective volume Bragg gratings or transmissive volume Bragg gratings. Output couplers 440 may have different coupling (e.g., diffraction) efficiencies at different locations. Substrate 420 may also allow light 450 from the environment in front of combiner 415 to pass through with little or no loss. Output couplers 440 may also allow light 450 to pass through with little loss. For example, in some implementations, output couplers 440 may have a very low diffraction efficiency for light 450 such that light 450 may be refracted or otherwise pass through output couplers 440 with little loss, and thus may have a higher intensity than extracted light 460. In some implementations, output couplers 440 may have a high diffraction efficiency for light 450 and may diffract light 450 in certain desired directions (i.e., diffraction angles) with little loss. As a result, the user may be able to view combined images of the environment in front of combiner 415 and images of virtual objects projected by projector 410.

Figure 5:
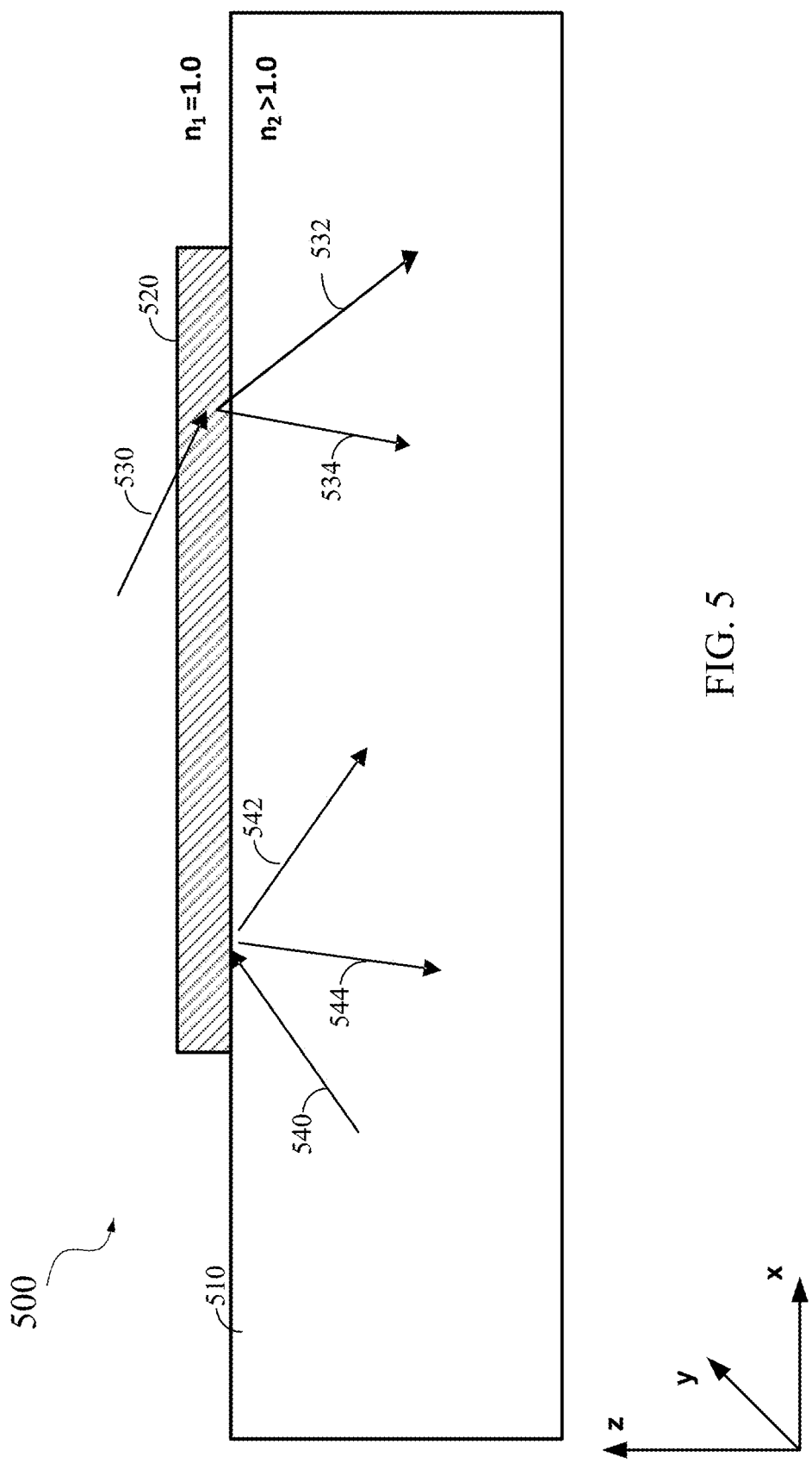
FIG. 5 illustrates propagations of display light and external light in an example of a waveguide display.

FIG. 5 illustrates propagations of display light 540 and external light 530 in an example waveguide display 500 including a waveguide 510 and a grating coupler 520. Waveguide 510 may be a flat or curved transparent substrate with a refractive index $n_2$ greater than the free space refractive index $n_1$ (e.g., 1.0). Grating coupler 520 may be, for example, a Bragg grating or a surface-relief grating.

Display light 540 may be coupled into waveguide 510 by, for example, input coupler 430 of FIG. 4 or other couplers (e.g., a prism or slanted surface) described above. Display light 540 may propagate within waveguide 510 through, for example, total internal reflection. When display light 540 reaches grating coupler 520, display light 540 may be diffracted by grating coupler 520 into, for example, a $0^{th}$ order diffraction (i.e., reflection) light 542 and a −1st order diffraction light 544. The $0^{th}$ order diffraction may propagate within waveguide 510, and may be reflected by the bottom surface of waveguide 510 towards grating coupler 520 at a different location. The −1st order diffraction light 544 may be coupled (e.g., refracted) out of waveguide 510 towards the user's eye, because a total internal reflection condition may not be met at the bottom surface of waveguide 510 due to the diffraction angle.

External light 530 may also be diffracted by grating coupler 520 into, for example, a 0th order diffraction light 532 and a −1st order diffraction light 534. Both the $0^{th}$ order diffraction light 532 and the −1st order diffraction light 534 may be refracted out of waveguide 510 towards the user's eye. Thus, grating coupler 520 may act as an input coupler for coupling external light 530 into waveguide 510, and may also act as an output coupler for coupling display light 540 out of waveguide 510. As such, grating coupler 520 may act as a combiner for combining external light 530 and display light 540. In general, the diffraction efficiency of grating coupler 520 (e.g., a surface-relief grating coupler) for external light 530 (i.e., transmissive diffraction) and the diffraction efficiency of grating coupler 520 for display light 540 (i.e., reflective diffraction) may be similar or comparable.

In order to diffract light at a desired direction towards the user's eye and to achieve a desired diffraction efficiency for certain diffraction orders, grating coupler 520 may include a blazed or slanted grating, such as a slanted Bragg grating or surface-relief grating, where the grating ridges and grooves may be tilted relative to the surface normal of grating coupler 520 or waveguide 510.

Figure 6:
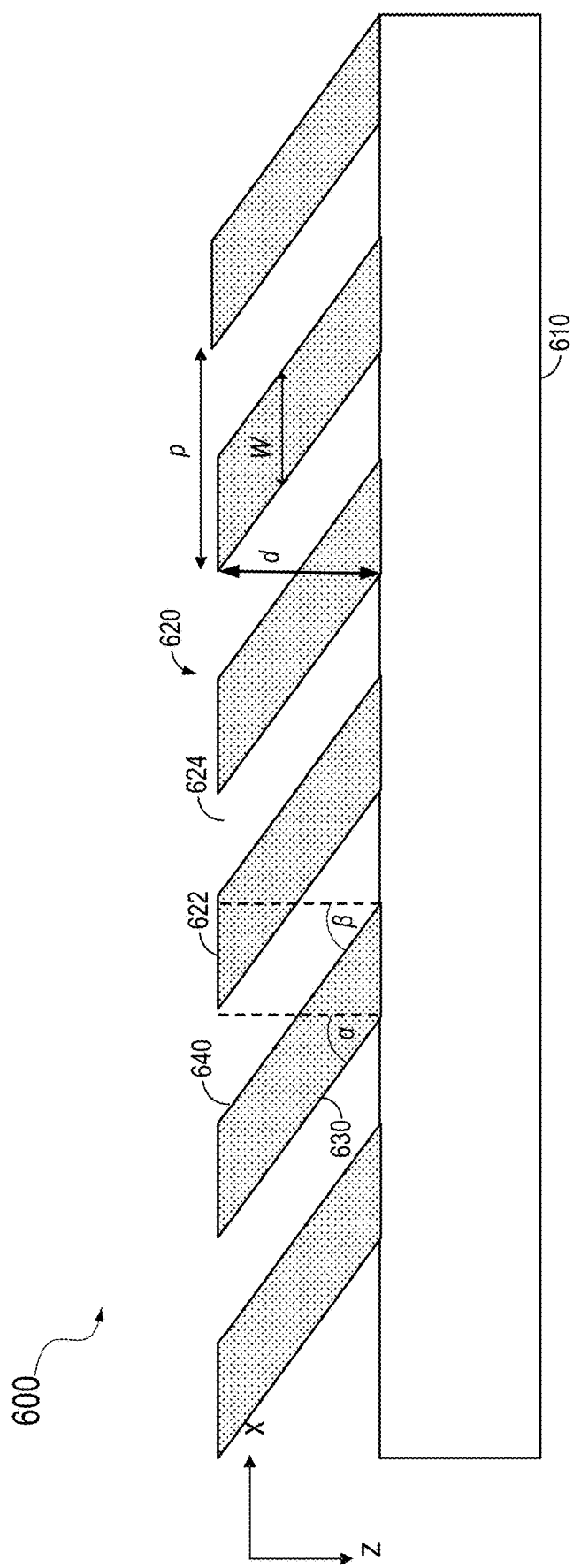
FIG. 6 illustrates an example of a slanted grating coupler in a waveguide display according to certain embodiments.

FIG. 6 illustrates an example of a slanted grating 620 in a waveguide display 600 according to certain embodiments. Slanted grating 620 may be an example of output couplers 440 or grating coupler 520. Waveguide display 600 may include slanted grating 620 on a waveguide 610, such as substrate 420 or waveguide 510. Slanted grating 620 may act as a grating coupler for couple light into or out of waveguide 610. In some embodiments, slanted grating 620 may include a periodic structure with a period p. For example, slanted grating 620 may include a plurality of ridges 622 and grooves 624 between ridges 622. Each period of slanted grating 620 may include a ridge 622 and a groove 624, which may be an air gap or a region filled with a material with a refractive index $n_{g2}$. The ratio between the width w of a ridge 622 and the grating period p may be referred to as duty cycle. Slanted grating 620 may have a duty cycle ranging, for example, from about 10% to about 90% or greater. In some embodiments, the duty cycle may vary from period to period. In some embodiments, the period p of the slanted grating may vary from one area to another on slanted grating 620, or may vary from one period to another (i.e., chirped) on slanted grating 620.

Ridges 622 may be made of a material with a refractive index of $n_{g1}$, such as silicon containing materials (e.g., $SiO_2$, $Si_3N_4$, SiC, $SiO_xN_y$, or amorphous silicon), organic materials (e.g., spin on carbon (SOC) or amorphous carbon layer (ACL) or diamond like carbon (DLC)), or inorganic metal oxide layers (e.g., $TiO_x$, $AlO_x$, $TaO_x$, $HfO_x$, etc.). Each ridge 622 may include a leading edge 630 with a slant angel α and a trailing edge 640 with a slant angle β. In some embodiments, leading edge 630 and training edge 640 of each ridge 622 may be parallel to each other. In other words, slant angle α is approximately equal to slant angle β. In some embodiments, slant angle α may be different from slant angle β. In some embodiments, slant angle α may be approximately equal to slant angle β. For example, the difference between slant angle α and slant angle β may be less than 20%, 10%, 5%, 1%, or less. In some embodiments, slant angle α and slant angle β may range from, for example, about 30° or less to about 70° or larger.

In some implementations, grooves 624 between the ridges 622 may be over-coated or filled with a material having a refractive index $n_{g2}$ higher or lower than the refractive index of the material of ridges 622. For example, in some embodiments, a high refractive index material, such as Hafnia, Titania, Tantalum oxide, Tungsten oxide, Zirconium oxide, Gallium sulfide, Gallium nitride, Gallium phosphide, silicon, and a high refractive index polymer, may be used to fill grooves 624. In some embodiments, a low refractive index material, such as silicon oxide, alumina, porous silica, or fluorinated low index monomer (or polymer), may be used to fill grooves 624. As a result, the difference between the refractive index of the ridges and the refractive index of the grooves may be greater than 0.1, 0.2, 0.3, 0.5, 1.0, or higher.

The user experience with an artificial reality system may depend on several optical characteristics of the artificial reality system, such as the field of view (FOV), image quality (e.g., resolution), size of the eye box of the system (to accommodate for eye and/or head movement), distance of the eye relief, optical bandwidth, and brightness of the displayed image. In general, the FOV and the eye box need to be as large as possible, the optical bandwidth needs to cover the visible band, and the brightness of the displayed image needs to be high enough (especially for optical see-through AR systems).

In a waveguide-based near-eye display, the output area of the display may be much larger than the size of the eyebox of the near-eye display system. The portion of light that may reach a user's eyes may depend on the ratio between the size of the eyebox and the output area of the display, which, in some cases, may be less than 10% for a certain eye relief and field of view. In order to achieve a desired brightness of the displayed image perceived by user's eyes, the display light from the projector or the light source may need to be increased significantly, which may increase the power consumption and cause some safety concerns.

Figure 7B:
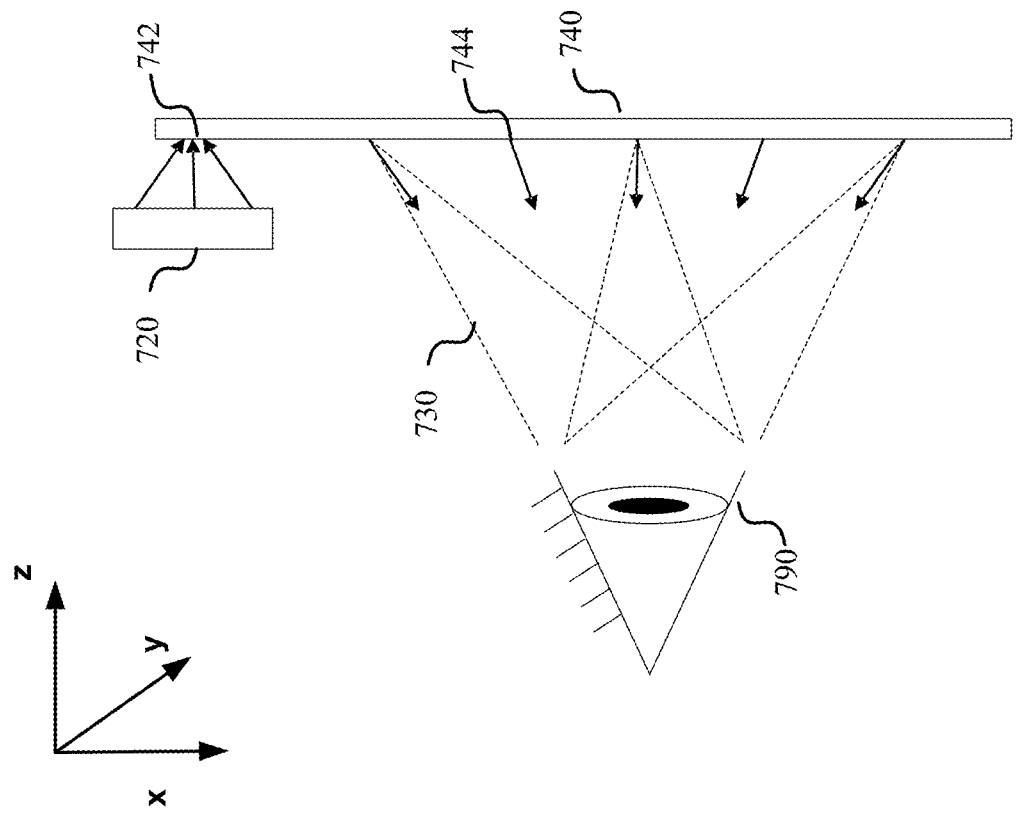
FIG. 7B illustrates an example of a waveguide-based near-eye display where display light may be coupled out of a waveguide display at different angles in different regions of the waveguide display according to certain embodiments.
Figure 7A:
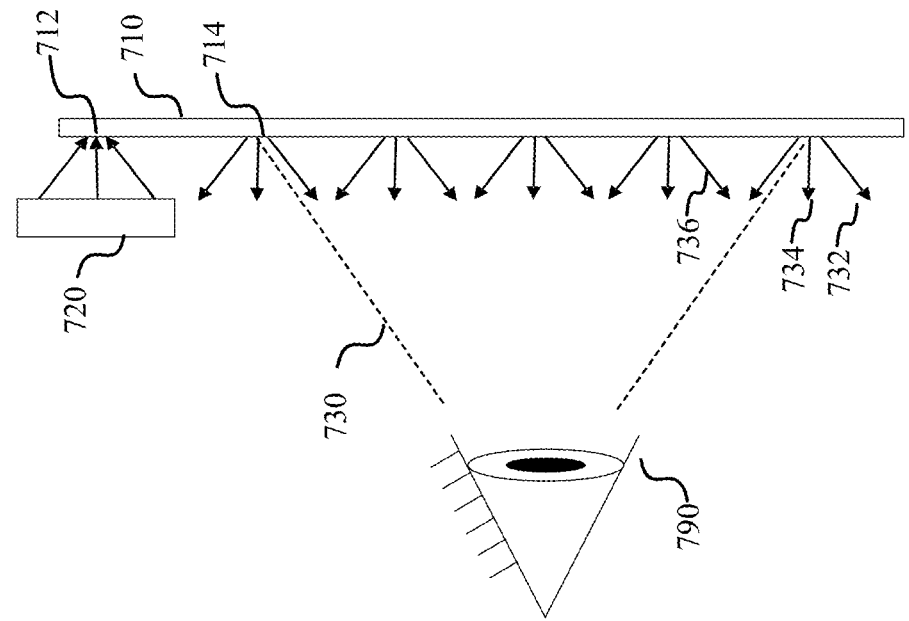
FIG. 7A illustrates an example of a waveguide-based near-eye display where display light for all fields of view is substantially uniformly output from different regions of a waveguide display.

FIG. 7A illustrates an example of a waveguide-based near-eye display where display light for all fields of view is substantially uniformly output from different regions of a waveguide display 710. The near-eye display may include a projector 720 and waveguide display 710. Projector 720 may be similar to projector 410 and may include a light source or image source similar to light source or image source 412 and projector optics similar to projector optics 414. Waveguide display 710 may include a waveguide (e.g., a substrate), one or more input couplers 712, and one or more output couplers 714. Input couplers 712 may be configured to couple display light from different fields of view (or viewing angles) into the waveguide. Output couplers 714 may be configured to couple display light out of the waveguide. The input and output couplers may include, for example, slanted surface-relief gratings or volume Bragg gratings. In the example shown in FIG. 7A, output coupler 714 may have similar grating parameters across the full region of the output coupler other than parameters that may be varied to adjust the coupling efficiency to achieve more uniform output light. Thus, the display light may be partially coupled out of the waveguide at different regions of waveguide display 710 in a similar manner as shown in FIG. 7A, where display light from all fields of view of the near-eye display may be partially coupled out of the waveguide at any given region of waveguide display 710.

As also shown in FIG. 7A, the near-eye display system may have an eyebox at a certain eyebox position 790 and having a limited size and thus a limited field of view 730. As such, not all light coupled out of the waveguide in waveguide display 710 may reach the eyebox at eyebox position 790. For example, display light 732, 734, and 736 from waveguide display 710 may not reach the eyebox at eyebox position 790, and thus may not be received by the user's eyes, which may result in significant loss of the optical power from projector 720.

In certain embodiments, an optical coupler (e.g., a slanted surface-relief grating) for a waveguide-based display may include a grating coupler that includes multiple regions (or multiple multiplexed grating). Different regions of the grating coupler may have different angular selectivity characteristics (e.g., constructive interference conditions) for the incident display light such that, at any region of the waveguide-based display, diffraction light that would not eventually reach user's eyes may be suppressed (i.e., may not be diffracted by the grating coupler so as to be coupled into or out of the waveguide and thus may continue to propagate within the waveguide), while light that may eventually reach the user's eyes may be diffracted by the grating coupler and be coupled into or out of the waveguide.

FIG. 7B illustrates an example of a waveguide-based near-eye display where display light may be coupled out of a waveguide display 740 at different angles in different regions of the waveguide display according to certain embodiments. Waveguide display 740 may include a waveguide (e.g., a substrate), one or more input couplers 742, and one or more output couplers 744. Input couplers 742 may be configured to couple display light from different fields of view (e.g., viewing angles) into the waveguide, and output couplers 744 may be configured to couple display light out of the waveguide. The input and output couplers may include, for example, slanted surface-relief gratings or other gratings. The output couplers may have different grating parameters and thus different angular selectivity characteristics at different regions of the output couplers. Thus, at each region of the output couplers, only display light that would propagate in a certain angular range towards the eyebox at eyebox position 790 of the near-eye display may be coupled out of the waveguide, while other display light may not meet the angular selectivity condition at the region and thus may not be coupled out of the waveguide. In some embodiments, the input couplers may also have different grating parameters and thus different angular selectivity characteristics at different regions of the input couplers, and thus, at each region of an input coupler, only display light from a respective field of view may be coupled into the waveguide. As a result, most of the display light coupled into the waveguide and propagating in the waveguide can be efficiently sent to the eyebox, thus improving the power efficiency of the waveguide-based near-eye display system.

The refractive index modulation of a slanted surface-relief grating, and other parameters of the slanted surface-relief grating, such as the grating period, the slant angle, the duty cycle, the depth, and the like, may be configured to selectively diffract incident light within a certain incident angular range and/or a certain wavelength band at certain diffraction directions (e.g., within an angular range shown by field of view 730). For example, when the refractive index modulation is large (e.g., >0.2), a large angular bandwidth (e.g., >10°) may be achieved at the output couplers to provide a sufficiently large eyebox for the waveguide-based near-eye display system.

In many applications, to diffract light at a desired direction towards the user's eye, to achieve a desired diffraction efficiency for certain diffraction orders, to increase the field of view and reduce rainbow artifacts of a waveguide display, a grating coupler may include a blazed or slanted grating, such as a slanted surface-relief grating, where the grating ridges and grooves may be tilted relative to the surface normal direction of the grating coupler or waveguide. In addition, in some embodiments, it may be desirable that the grating has a height or depth profile that is non-uniform over the area of the grating, and/or has a grating period or duty cycle that varies across the grating, in order to improve the performance of the grating, such as to achieve different diffraction characteristics (e.g., diffraction efficiencies and/or diffraction angles) at different areas of the grating.

FIG. 8A illustrates a cross-section of an example of a slanted grating 800 used in an example of a waveguide display according to certain embodiments. The cross-section shown in FIG. 8A may be in an x-z plane. Slanted grating 800 may include a grating region 820 in a substrate 810. Slanted grating 800 may act as a grating coupler for couple light into or out of a waveguide. In some embodiments, slanted grating 800 may include a structure with a period p, which may be a constant or may vary across the area of slanted grating 800. Slanted grating 800 may include a plurality of ridges 822 and a plurality of grooves 824 between ridges 822. Each period of slanted grating 800 may include a ridge 822 and a groove 824, which may be an air gap or a region filled with a material with a refractive index different from the refractive index of ridge 822. The ratio between the width of a ridge 822 and the grating period p may be referred to as the duty cycle. Slanted grating 800 may have a duty cycle ranging, for example, from about 30% to about 70%, or from about 10% to about 90% or greater. In some embodiments, the duty cycle may vary from period to period or from area to area. In some embodiments, the period p of the slanted grating may vary from one area to another in slanted grating 800, or may vary from one period to another (i.e., chirped) in slanted grating 800.

Ridges 822 may be made of a material, such as silicon containing materials (e.g., $SiO_2$, $Si_3N_4$, SiC, $SiO_xN_y$, or amorphous silicon), organic materials (e.g., spin-on carbon, amorphous carbon layer, or diamond like carbon), or inorganic metal oxide layers (e.g., $TiO_x$, $AlO_x$, $TaO_x$, or $HfO_x$). Each ridge 822 may include a leading edge 830 with a slant angel α and a trailing edge 840 with a slant angle β. In some embodiments, leading edge 830 and trailing edge 840 of each ridge 822 may be parallel to each other. In some embodiments, slant angle α may be different from slant angle β. In some embodiments, slant angle α may be approximately equal to slant angle β. For example, the difference between slant angle α and slant angle β may be less than 20%, 10%, 5%, 1%, or less. In some embodiments, slant angle α and slant angle β may range from, for example, about 30° or less to about 70° or larger, such as about 45° or larger. In some embodiments, slant angle α and/or slant angle β may also vary from ridge to ridge in slanted grating 800.

Each groove 824 may have a depth d in the z direction, which may be a constant or may vary across the area of slanted grating 800. In some embodiments, the depths of grooves 824 may vary across the area of slanted grating 800 according to a pattern or a depth profile 850. In some embodiments, the depths of grooves 824 may include multiple depth levels, such as 8 depth levels, 16 depth levels, 32 depth levels, or more. In some embodiments, the depths of grooves 824 may vary from 0 to about 100 nm, 200 nm, 300 nm, or deeper. In some implementations, grooves 824 between ridges 822 may be over-coated or filled with a material having a refractive index higher or lower than the refractive index of the material of ridges 822. For example, in some embodiments, a high refractive index material, such as Hafnia, Titania, Tantalum oxide, Tungsten oxide, Zirconium oxide, Gallium sulfide, Gallium nitride, Gallium phosphide, silicon, or a high refractive index polymer, may be used to fill grooves 824. In some embodiments, a low refractive index material, such as silicon oxide, alumina, porous silica, or fluorinated low index monomer (or polymer), may be used to fill grooves 824. As a result, the difference between the refractive index of the ridges and the refractive index of the grooves may be greater than 0.1, 0.2, 0.3, 0.5, 1.0, or higher.

FIG. 8B illustrates another cross-section of the example of slanted grating 800 with variable etch depths shown in FIG. 8A according to certain embodiments. The cross-section shown in FIG. 8B may be a cross-section along a line A-A shown in FIG. 8A, and thus may be in a y-z plane. A curve 860 in FIG. 8B illustrates the depth profile of a particular grating groove 824, which may vary in the y direction. In the example shown in FIG. 8B, grating region 820 may include a one-dimensional slanted grating with variable etch depths, where the one-dimensional slanted grating may include, in the x direction, the plurality of ridges 822 and the plurality of grooves 824.

In some embodiments, slanted grating 800 may include a two-dimensional slanted grating with variable depths. The two-dimensional slanted grating may include, in the x direction, the plurality of ridges 822 and the plurality of grooves 824, and, in the y direction, a plurality of ridges and a plurality of grooves. The two-dimensional slanted grating may have a respective grating period in each of the x and y directions. In such embodiments, a cross-section of slanted grating 800 in a y-z plane may be similar to the cross-section of slanted grating 800 in an x-z plane as shown in FIG. 8A.

As such, slanted grating 800 may have a 3D structure, the physical dimensions of which may vary in the x, y, and/or z directions. For example, the grating period or duty cycle of slanted grating 800 may vary in the x-y plane and may also vary in the z-direction if slant angle α is different from slant angle β. The depths of grooves 824 in the z direction may vary in the x and/or y directions. In some embodiments, the slant angle α and/or β with respect to the z direction may also vary along the x and/or y directions in slanted grating 800.

The slanted surface-relief gratings with parameters and configurations (e.g., duty cycles, depths, or refractive index modulations) varying over the regions of the gratings described above may be fabricated using many different nanofabrication techniques. The nanofabrication techniques generally include a patterning process and a post-patterning (e.g., over-coating) process. The patterning process may be used to form slanted ridges or grooves of the slanted grating.

There may be many different nanofabrication techniques for forming the slanted ridges. For example, in some implementations, the slanted grating may be fabricated using lithography techniques including slanted etching. In some implementations, the slanted grating may be fabricated using nanoimprint lithography (NIL) molding techniques, where a master mold including slanted structures may be fabricated using, for example, slanted etching techniques, and may then be used to mold slanted gratings or different generations of soft stamps for nanoimprinting. The post-patterning process may be used to over-coat the slanted ridges and/or to fill the gaps between the slanted ridges with a material having a different refractive index than the slanted ridges. The post-patterning process may be independent from the patterning process. Thus, a same post-patterning process may be used on slanted gratings fabricated using any patterning technique.

Techniques and processes for fabricating slanted gratings described herein are for illustration purposes only and are not intended to be limiting. A person skilled in the art would understand that various modifications may be made to the techniques described below. For example, in some implementations, some operations described below may be omitted. In some implementations, additional operations may be performed to fabricate the slanted gratings. Techniques disclosed herein may also be used to fabricate other slanted structures on various materials.

Figure 9:
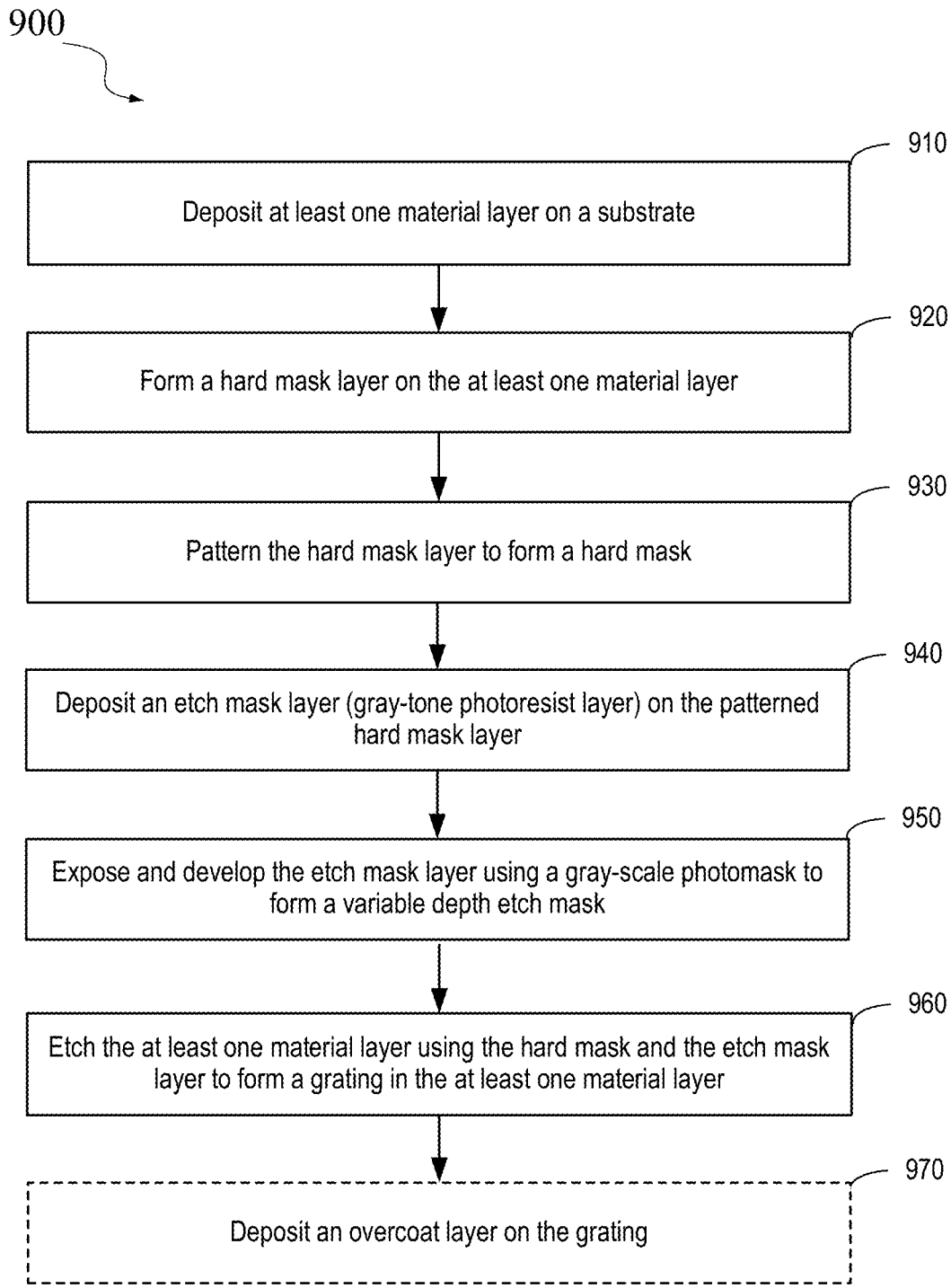
FIG. 9 includes a flow chart illustrating an example of a process for fabricating a grating with a variable depth according to certain embodiments.

FIG. 9 is a flow chart 900 illustrating an example of a process for fabricating a grating with a variable depth profile according to certain embodiments. The process described in flow chart 900 may be referred to as a gray-tone-last process. The operations described in flow chart 900 are for illustration purposes only and are not intended to be limiting. In various implementations, modifications may be made to flow chart 900 to add additional operations, omit some operations, or change the order of the operations. The operations described in flow chart 900 may be performed using, for example, one or more semiconductor fabrication systems, such as a spin coating system, a chemical vapor deposition (CVD) system, a physical vapor deposition (PVD) system, an ion or plasma etching (e.g., ion beam etching (IBE), plasma etching (PE), or reactive ion etching (RIE)) system, a photolithography system, and the like.

At block 910, at least one material layer may be deposited on a substrate. The substrate may be a transparent substrate, such as a glass substrate. The substrate may be flat or may be curved, and may include, for example, a lens, such as a vision correction lens or a lens for correcting one or more types of optical errors. The substrate may include a material having a first refractive index, for example, from about 1.45 to about 2.4, such as about 1.9. The material layer may include a uniform layer of a material having a second refractive index, such as close to the first refractive index. The material layer may include, for example, a semiconductor material, a dielectric material, a polymer, and the like. In one example, the material layer may include SiN, which may have a refractive index about 2.0. The material layer may be deposited on the substrate by, for example, spin coating, PVD, CVD (e.g., low pressure chemical vapor deposition (LPCVD) or plasma-enhanced chemical vapor deposition (PECVD)), and the like. In some embodiments, multiple material layers with desired thicknesses and refractive indices may be sequentially deposited on the substrate. Each of the multiple material layers may be a material layer having a uniform thickness. The refractive indices of the multiple material layers may gradually increase or gradually decrease.

At block 920, a hard mask layer may be formed on the at least one material layer. The hard mask layer may include, for example, a metal or metal alloy material, such as chromium or chromium oxide. The hard mask layer may have a high resistance to dry etching, such as plasma etching. The hard mask layer may be formed on the at least one material layer using, for example, PVD.

At block 930, the hard mask layer may be patterned to form a hard mask that includes a desired light transmissivity pattern. In some embodiments, the hard mask layer may be patterned using a tri-layer structure that includes an organic dielectric layer (ODL) at the bottom, an anti-reflection coating layer in the middle, and a photoresist layer at the top. The photoresist layer may be patterned and used as the etch mask to etch the anti-reflection coating layer, the ODL layer, and the hard mask layer to form the hard mask with the desired light transmissivity pattern. For example, the hard mask layer (e.g., chromium) may be etched in an $O_2$ and $Cl_2$ or $CCl_4$ environment to form a volatile etching product $CrO_2Cl_2$.

At block 940, an etch mask layer may be deposited on the patterned hard mask layer. The etch mask layer may include a layer of a gray-tone photoresist material that may have a linear or another known response to exposure dosage, such that the exposure depth may be a function of the exposure dosage. The gray-tone photoresist material may be deposited on the hard mask layer by, for example, spin coating or spray coating.

At block 950, the etch mask layer may be exposed to a light beam through a gray-scale photomask that has different transmissivities at different regions, and may then be developed to remove the exposed portions of the photoresist material to form an etch mask with a variable thickness. The etch mask layer may have a desired thickness profile, such as a ramp-shaped profile or another profile that varies in one or two dimensions.

At block 960, the etch mask layer and the at least one material layer may be etched to linearly or nonlinearly transfer the thickness profile of the etch mask layer into the at least one material layer. The etching may be, for example, vertical or slanted dry etching using ion or plasma beams. The etch time may be controlled to achieve the desired etch depths in the at least one material layer. The etch mask layer with the variable thickness may be completely etched by the etching process, or may not be fully etched by the etching process but may be subsequently removed by a photoresist stripping process using, for example, an organic or inorganic stripper. Regions of the at least one material layer under the hard mask may not be etched, such that a grating with a variable depth and a pattern similar to the pattern of the hard mask may be formed in the at least one material layer.

Optionally, at block 970, an overcoat layer with a desired refractive index may be formed on the etched grating to fill the grating grooves. For example, in some embodiments, a high refractive index material, such as Hafnia, Titania, Tantalum oxide, Tungsten oxide, Zirconium oxide, Gallium sulfide, Gallium nitride, Gallium phosphide, silicon, or a high refractive index polymer, may be used to fill the grating grooves. In some embodiments, a low refractive index material, such as silicon oxide, alumina, porous silica, or fluorinated low index monomer (or polymer), may be used to fill the grating grooves.

FIGS. 10A-10F illustrate an example of a process 1000 for manufacturing a grating with a variable grating depth according to certain embodiments. The illustrated process may be an example of the gray-tone-last process described with respect to FIG. 9. FIG. 10A shows a substrate 1010

(e.g., a glass substrate) with a grating material layer 1020 formed thereon. Even though one grating material layer 1020 is shown in the example, two or more grating material layers may be deposited on substrate 1010. The two or more grating material layers may have different refractive indices and/or different thicknesses.

FIG. 10B shows mask layers formed on grating material layer 1010. The mask layers may include, for example, a hard mask layer 1030 (e.g., a metal or metal alloy material, such as Cr) and a tri-layer mask formed on hard mask layer 1030. The tri-layer mask may be used to pattern hard mask layer 1030. As described above, the tri-layer mask may include, for example, an ODL 1040 at the bottom, a silicon-containing hard mask bottom (SHB) anti-reflection coating layer 1050 in the middle, and a photoresist layer 1060 at the top. FIG. 10B shows that photoresist layer 1060 has been patterned using, for example, a photolithography process. In some embodiments, a bottom anti-reflective coating (BARC) layer may be formed on hard mask layer 1030 before forming the tri-layer mask.

FIG. 10C shows that an etching process is performed to remove parts of the tri-layer mask and parts of hard mask layer 1030 to form opening 1042 in the mask layers, so as to form a pattern in hard mask layer 1030. FIG. 10D shows that the tri-layer mask has been removed to expose the patterned hard mask layer 1030. In some embodiments, a BARC layer may be formed on the patterned hard mask layer 1030 before the next process step.

FIG. 10E shows that an etch mask 1070 is formed on the patterned hard mask layer 1030. Etch mask 1070 may have a desired height or thickness profile. Etch mask 1070 may be formed, using a gray-tone mask, in a photoresist material layer that has a linear or other known response to exposure dosage. Because of the gray-tone mask, different regions of the photoresist material layer may be exposed to different exposure doses and thus the depths of the exposed photoresist material in different regions may be different as well. Etch mask 1070 with the desired thickness profile may be formed after the development of the photoresist material to remove the exposed photoresist material.

FIG. 10F shows that a slanted etching process is performed using etch mask 1070 and patterned hard mask layer 1030 to transfer the pattern in pattern hard mask layer 1030 and the height profile of etch mask 1070 into grating material layer 1020. Thus, a plurality of grating grooves 1022 may be formed in grating material layer 1020. The etching process may include a dry etching process, such as ion or plasma etching (e.g., IBE, PE, or RIE). The ion or plasma beam may be slanted (e.g., at an angle greater than about 10°, 30°, or 45°) with respect to the surface normal direction of grating material layer 1020, such that grating grooves 1022 may be slanted to form a slanted grating in grating material layer 1020. After the etching, the remaining etch mask 1070 (if any) and patterned hard mask layer 1030 may be removed, and the slanted grating may optionally be coated with an overcoat layer as described above.

FIGS. 11A-11C illustrate an example of a process 1100 for forming an etch mask (e.g., etch mask 1070) having a desired thickness profile using a gray-scale photomask according to certain embodiments. The illustrated process 1100 may be an example of the process described with respect to FIG. 10E. FIG. 11A shows a substrate 1110 (or a grating material layer formed on a substrate) having a hard mask 1120 (e.g., a chromium-based hard mask) and a photoresist material layer 1130 formed thereon. Hard mask 1120 may be formed as described above with respect to FIGS. 10A-10D. Photoresist material layer 1130 may include a low contrast photoresist material that has a linear or other non-binary response to exposure dosage. In some embodiments, the photoresist material may be sensitive to light with a wavelength shorter than 300 nm. In some embodiments, the photoresist material may be characterized by an etch rate that is between about 0.5 and about 5 times of an etch rate of substrate 1110. In some embodiments, the photoresist material may be characterized by a linear response to ultraviolet (UV) light dose such that a depth of an exposed portion of the photoresist material is a linear function of the UV light dose. In some embodiments, the photoresist material may include a positive-tone photoresist. In some embodiments, the photoresist material layer may include Poly(methyl methacrylate) (PMMA) sensitized with a photosensitive group. The photosensitive group may include, for example, at least one of an acyloximino group, methacrylonitrile, terpolymer of methyl methacrylate, oximino methacrylate, benzoic acids, N-acetylcarbazole, or indenone. In some embodiments, the photoresist material layer may include at least one of poly(methyl methacrylate)-r-poly(tert-butyl methacrylate)-r-poly(methyl methacrylate) and a photo acid generator, poly(methyl methacrylate)-r-poly(methacrylic acid), poly($\alpha$-methylstyrene-co-methyl chloroacrylate) and an acid generator, polycarbonate and a photo acid or base generator, polylactide and a photo acid or base generator, or polyphthalaldehyde and a photo acid generator. In some embodiments, a BARC layer may be formed on hard mask 1120 before depositing photoresist material layer 1130.

FIG. 11B shows that photoresist material layer 1130 is exposed to UV light 1150 through a gray-scale photomask 1140. UV light 1150 may have a wavelength shorter than, for example, 300 nm, such as between about 240 nm and 280 nm, at 193 nm, at 157 nm, or lower (e.g., at a deep UV wavelength). Gray-scale photomask 1140 may include a transparent substrate and a layer having a UV light transmissivity varying across its area. As illustrated, in areas of photoresist material layer 1130 corresponding to areas of gray-scale photomask 1140 that have higher transmissivities, the depths of the exposed portions 1132 of photoresist material layer 1130 may be higher. FIG. 11C shows that a patterned photoresist layer 1134 is formed in photoresist material layer 1130 after the development and removal of exposed portions 1132.

Figure 12A:
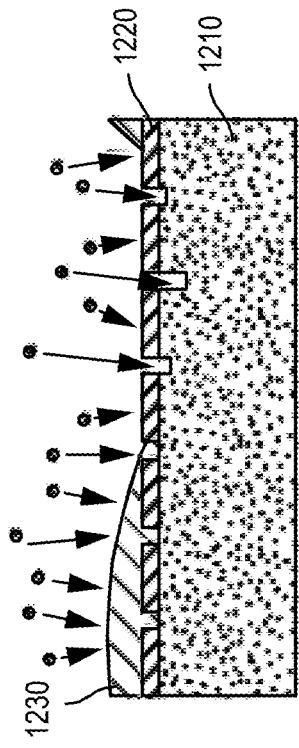
FIGS. 12A-12D illustrate an example of a process for transferring the thickness profile of an etch mask to a underlying material layer according to certain embodiments.

FIGS. 12A-12D illustrate an example of a process for transferring the thickness profile of an etch mask to an underlying material layer according to certain embodiments. The illustrated process may be an example of the process described above with respect to FIG. 10F. FIG. 12A shows a patterned photoresist layer 1230 (e.g., patterned photoresist layer 1134) on a substrate 1210 (e.g., substrate 1110, or a grating material layer formed on a substrate) having a hard mask 1220 (e.g., hard mask 1120) formed thereon.

Figure 12B:
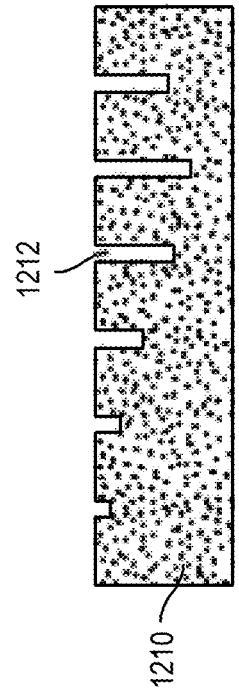

FIG. 12B shows an ion etching process that etches portions of patterned photoresist layer 1230 and, in some areas, etches portions of substrate 1210. The etch depth of substrate 1210 is the highest in areas of substrate 1210 that correspond to areas of patterned photoresist layer 1230 with the lowest thicknesses. In some embodiments, etching the patterned photoresist layer 1230 and substrate 1210 may include etching patterned photoresist layer 1230 and substrate 1210 using at least one of an oxygen source including $O_2$, $N_2O$, $CO_2$, or CO, a nitrogen source including $N_2$, $N_2O$, or $NH_3$, or ions with an energy between about 100-500 eV. In some embodiments, the etching may be a slanted etching with a slant angle greater than, for example, about 10°, about 30°, or about 45°.

Figure 12C:
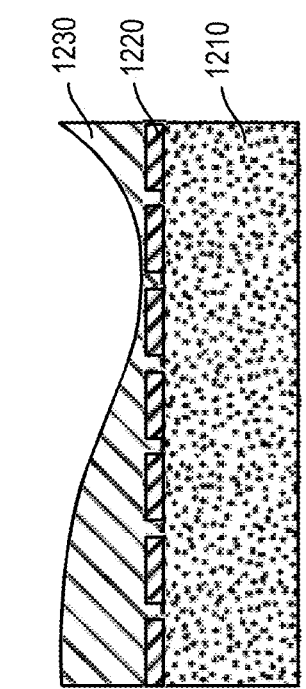
Figure 12D:
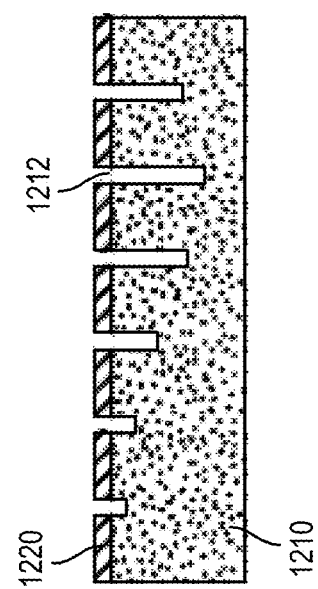

FIG. 12C shows that patterned photoresist layer 1230 is completely etched or the remaining portion of patterned photoresist layer 1230 has been removed by a remover or a stripper (e.g., a solvent). As illustrated in FIG. 12C, the depths of a grating groove 1212 in substrate 1210 may be different in different areas of substrate 1210. In some embodiments, the depths of grating grooves 1212 in substrate 1210 may include at least 8 different depth levels. A maximum depth of the non-uniform etch depth in substrate 1210 may be greater than about 100 nm, greater than about 200 nm, greater than about 300 nm, or greater than about 500 nm. FIG. 12D shows that hard mask 1220 has been removed to expose the grating in substrate 1210.

Alternatively or additionally, a gray-tone-first process may be used to fabricate surface-relief gratings with variable etch depths. In the gray-tone-first process, gray-tone photolithography techniques may be used to form one or more grating material layers with desired thickness profiles, a patterned hard mask may be formed on the grating material layers, and the grating material layers may then be etched using the patterned hard mask. The grating material layers may be etched through to exposed the underlying substrate (which may be used an etch stopper). In some embodiments, the grating material layers formed using the gray-tone-first process may be etched using a gray-tone-last process described above.

Figure 13:
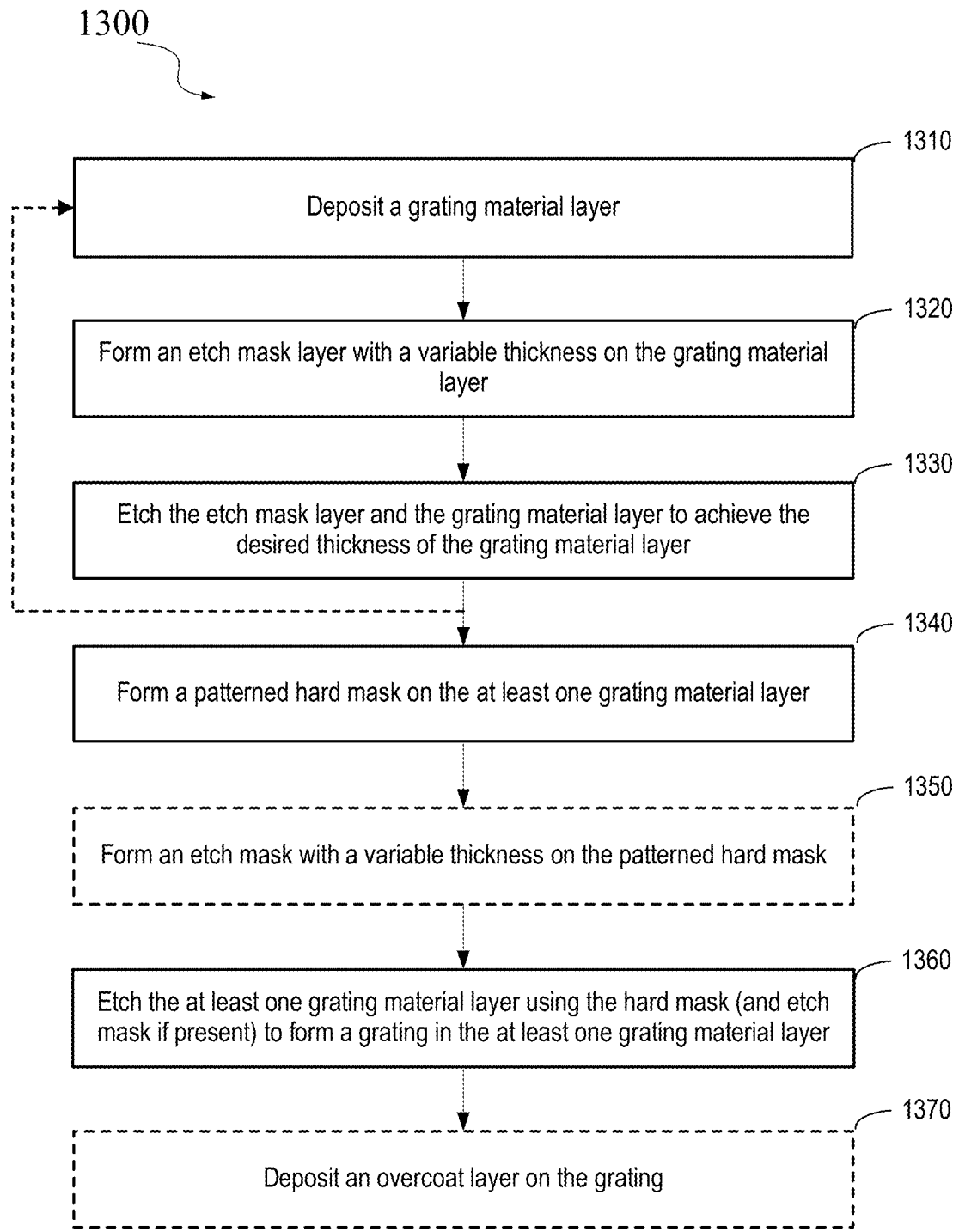
FIG. 13 includes a flow chart illustrating an example of a process for fabricating a grating with a variable depth according to certain embodiments.

FIG. 13 includes a flow chart 1300 illustrating an example of a process for fabricating a grating with a variable depth according to certain embodiments. The operations described in flow chart 1300 are for illustration purposes only and are not intended to be limiting. In various implementations, modifications may be made to flow chart 1300 to add additional operations, to omit some operations, or to change the order of the operations. The operations described in flow chart 1300 may be performed by, for example, one or more semiconductor fabrication systems, such as a spin coating system, a CVD system, a PVD system, an ion or plasma etching (e.g., IBE, PE, or RIE) system, a photolithography system, and the like.

At block 1310, a grating material layer may be deposited on a substrate as described above with respect to, for example, block 910 or FIG. 10A. The substrate may be a transparent substrate, such as a glass substrate. The substrate may be flat or may be curved, and may include, for example, a lens, such as a vision correction lens or a lens for correcting one or more types of optical errors. The substrate may include a material having a first refractive index, for example, from about 1.45 to about 2.4, such as about 1.9. The grating material layer may include a uniform layer of a material having a second refractive index, such as close to the first refractive index. The grating material layer may include, for example, a semiconductor material, a dielectric material, a polymer, and the like. The grating material layer may be deposited on the substrate by, for example, spin coating, PVD, CVD (e.g., LPCVD or PECVD), and the like.

At block 1320, an etch mask layer with a variable thickness may be formed on the grating material layer. The etch mask layer may include a desired thickness profile, such as a ramp-shaped profile or another profile that varies in one or two dimensions. As described above with respect to blocks 940 and 950 and FIGS. 11A-11C, the etch mask layer may be made by depositing a layer of gray-tone photoresist material that may have a linear or other non-binary response to exposure dosage, exposing the layer of gray-tone photoresist material to light using a gray-scale photomask that has different transmissivities at different regions, and developing the layer of gray-tone photoresist material after exposure to remove the exposed portions of the photoresist material.

At block 1330, the etch mask layer and the grating material layer may be etched to change the thickness of the grating material layer by linearly or nonlinearly transferring the thickness profile of the etch mask layer into the grating material layer. The etching may be, for example, vertical dry etching using ion or plasma beams as described above. The etch time may be controlled to achieve the desired thickness of the remaining grating material layer. The etch mask layer may be completely etched by the etching process, or may not be fully etched by the etching process and may be removed by a photoresist stripping process using, for example, an organic or inorganic stripper.

The operations at block 1310 and/or blocks 1320-1330 may optionally be repeated to form additional grating material layers on the substrate. The additional grating material layers may each have a desirable thickness profile, such as a uniform thickness profile or a thickness profile that varies in one or two dimensions. The additional grating material layers may include different respective materials with different respective refractive indices. Thus, the grating material layers may form a structure with a refractive index gradient. For example, the refractive index of the structure may gradually decrease (or increase) with the increase in the distance from the substrate. In some embodiments, the grating material layers may have different respective thickness profiles such that the grating fabricated in the grating material layers may reduce the leakage of the display light.

At block 1340, a patterned hard mask may be formed on the at least one grating material layer. The hard mask may include, for example, a hard mask material layer (e.g., a metal or metal alloy material, such as Cr). As described above with respect to, for example, block 920 and FIGS. 10B-10C, the hard mask material layer may be patterned using, for example, a tri-layer mask that includes an ODL layer, a SHB anti-reflection coating layer, and a photoresist layer. The photoresist layer may be patterned and used as the etch mask to etch the SHB anti-reflection coating layer, the ODL layer, and the hard mask material layer to form the hard mask with a desired light transmissivity pattern.

Optionally, at block 1350, an etch mask with a variable thickness may be formed on the hard mask as described above with respect to, for example, FIGS. 11A-11C and block 1320. The etch mask with the variable thickness may be formed by depositing a layer of gray-tone photoresist material that may have a linear or other non-binary response to exposure dosage, exposing the layer of gray-tone photoresist material to light using a gray-scale photomask that has different transmissivities at different regions, and developing the layer of gray-tone photoresist material after exposure to remove the exposed portions of the photoresist material.

At block 1360, the at least one grating material layer may be etched using the hard mask (and the etch mask if present) to form a grating in the at least one grating material layer. The etching may be vertical or slanted etching. For example, in some embodiments, the etching may be slanted etching using ion or plasma beams as described above. In some embodiments, the etch time may be controlled to achieve the desired depth for the grating as shown in, for example, FIG. 10F and FIG. 12C. In some embodiments, the at least one grating material layer may have a variable overall thickness, the substrate or another layer may be used as the etch stop layer for etching through the at least one grating material layer, and thus the etch time may not need to be precisely controlled.

Optionally, at block 1370, an overcoat layer with a desired refractive index may be formed on the etched grating to fill the grating grooves. For example, in some embodiments, a high refractive index material, such as Hafnia, Titania, Tantalum oxide, Tungsten oxide, Zirconium oxide, Gallium sulfide, Gallium nitride, Gallium phosphide, silicon, or a high refractive index polymer, may be used to fill the grating grooves. In some embodiments, a lower refractive index material, such as silicon oxide, alumina, porous silica, or fluorinated low index monomer (or polymer), may be used to fill the grating grooves.

FIGS. 14A-14G illustrate an example of a process 1400 for manufacturing a grating with a variable grating depth according to certain embodiments. The illustrated process 1400 may be an example of the gray-tone-first process described with respect to FIG. 13. FIG. 14A shows a substrate 1410, which may be a transparent substrate, such as a glass substrate. Substrate 1410 may be flat or may be curved. For example, substrate 1410 may include a lens, such as a vision correction lens or a lens for correcting one or more types of optical errors. Substrate 1410 may have a first refractive index, for example, from about 1.45 to about 2.4, such as about 1.9. A grating material layer 1420 may be deposited on substrate 1410. Grating material layer 1420 may include a uniform layer of a material having a second refractive index, such as close to the first refractive index. Grating material layer 1420 may include, for example, a semiconductor material, a dielectric material, a polymer, and the like. In one example, grating material layer 1420 may include SiN, which may have a refractive index about 2.0. Grating material layer 1420 may be deposited on substrate 1410 by, for example, spin coating, PVD, CVD (e.g., LPCVD or PECVD), and the like.

FIG. 14B illustrates a gray-tone photoresist layer 1422 formed on grating material layer 1420. Gray-tone photoresist layer 1422 may include a desired thickness profile, such as a ramp-shaped profile or a thickness profile that varies in one or two dimensions. As described above with respect to, for example, blocks 940, 950, and 1320 and FIGS. 10E and 11A-11C, gray-tone photoresist layer 1422 may be made by depositing a layer of gray-tone photoresist material, exposing the layer of gray-tone photoresist material to light using a gray-scale photomask that has different transmissivities at different regions, and developing the layer of gray-tone photoresist material after exposure to remove the exposed portion of the gray-tone photoresist material.

FIG. 14C illustrates that grating material layer 1420 has been etched using gray-tone photoresist layer 1422 to linearly or nonlinearly transfer the height profile of gray-tone photoresist layer 1422 into grating material layer 1420. The etching may be, for example, vertical dry etching using ion or plasma beams as described above. The etch time may be controlled to achieve the desired thickness of grating material layer 1420. Gray-tone photoresist layer 1422 may be completely etched by the etching process, or may not be fully etched by the etching process but may be removed by a photoresist stripping process using, for example, an organic or inorganic stripper.

FIG. 14D illustrates examples of mask layers formed on grating material layer 1420. The mask layers may include, for example, a hard mask material layer 1430 (e.g., a metal or metal alloy material, such as Cr) and a tri-layer mask formed on the hard mask material layer. As described above with respect to, for example, FIGS. 10B and 10C, the tri-layer mask may be used to pattern hard mask material layer 1430 and may include, for example, an organic dielectric layer 1432 at the bottom, an anti-reflection coating layer 1434 in the middle, and a photoresist layer 1436 at the top. In some embodiments, a BARC layer may be formed on hard mask material layer 1430 before forming the tri-layer mask. FIG. 14D shows that photoresist layer 1436 has been patterned using, for example, photolithography techniques.

FIG. 14E shows that a dry or wet etching process is performed to remove parts of the tri-layer mask and parts of hard mask material layer 1430 to form opening 1440 in the mask layers, so as to form a pattern in hard mask material layer 1430. In the example shown in FIG. 14E, grating material layer 1420 may be used as the etch stop layer. FIG. 14F shows that the tri-layer mask has been removed to expose the patterned hard mask material layer 1430.

FIG. 14G shows that a slanted etching process has been performed to etch grating material layer 1420 using the patterned hard mask material layer 1430, where substrate 1410 may be used as an etch stop layer. Thus, grating material layer 1420 may be etched down to substrate 1410 to form a plurality of grating grooves 1424. The etching process may include a dry etching process, such as ion or plasma etching (e.g., IBE, PE, or RIE). The ion or plasma beam may be slanted with respect to the surface normal direction of substrate 1410 as described above, such that grating grooves 1424 may be slanted with respect to substrate 1410 to form a slanted grating in grating material layer 1420. Because of the variable thicknesses of grating material layer 1420, the grating formed in grating material layer 1420 may be a grating with a variable depth. After the etching, patterned hard mask material layer 1430 may be removed as shown in FIG. 14G. In some embodiments, the slanted grating may be coated with an overcoat layer (not shown in FIG. 14G) as described above.

Grating couplers may not have diffraction efficiencies close to 100% and may also diffract light in undesirable manners. Therefore, some artifacts may occur in the displayed images and/or some light may be leaked into the surrounding environment rather than reaching user's eye. For example, external light from a light source, such as the sun or a lamp, may be undesirably diffracted by the grating couplers to cause rainbow-colored images of the light source in the images displayed to the user's eye. Display light may also be leaked into the environment to cause interference, security, and privacy concerns.

FIG. 15A illustrates the propagation of external light 1530 in an example of a waveguide display 1500 with a grating coupler 1520 on the front side of a waveguide 1510. External light 1530 may be diffracted by grating coupler 1520 into a $0^{th}$ order diffraction light 1532 and a −1st order diffraction light 1534. The $0^{th}$ order diffraction light 1532 may be refracted out of waveguide 1510 in a direction shown by a light ray 1536, or may be directed toward user's eyes. The −1st order diffraction light 1534 may be refracted out of waveguide 1510 in a direction shown by a light ray 1538, which may reach the eyebox and user's eyes. For different wavelengths (colors), the $0^{th}$ order diffraction light may have a same diffraction angle, but the −1st order diffraction light may be wavelength dependent and thus may have different diffraction angles for light of different colors to cause rainbow-colored images.

FIG. 15B illustrates an example of leakage of display light in a waveguide display 1505. Waveguide display 1505 may be an example of optical see-through augmented reality system 400. Waveguide display 1505 may include a substrate 1550, an input coupler 1560, and an output coupler 1570, which may be similar to substrate 420, input coupler 430, and output coupler 440, respectively. As illustrated, display light 1540 may be coupled into substrate 1550 by input coupler 1560 such that the coupled-in display light may propagate within substrate 1550 through total internal reflection. As the display light reaches a surface of substrate 1550 where output coupler 1570 is formed, a portion of the display light may be reflectively diffracted such that the portion of the display light may be coupled out of substrate 1550 towards user's eyes as illustrated by a light beam 1580. A portion of the display light entering output coupler 1570 may not be reflectively diffracted or may be transmissively diffracted by output coupler 1570, and thus may be coupled out of the substrate towards the front of waveguide display 1505 (e.g., in the z direction) as shown by a light beam 1590. Light beam 1590 may be visible to viewers in front of waveguide display 1505. Thus, viewers in front of waveguide display 1505 may be able to view the displayed images, which may be undesirable in many circumstances.

According to certain embodiments, certain optical artifacts, such as rainbow images, may be reduced using, for example, slanted gratings. The leakage of the display light may be reduced using, for example, a grating coupler characterized by a gradient refractive index or including multiple layers with different (e.g., increasing or decreasing) refractive indices. In some embodiments, each of the multiple layers may have a respective thickness profile. The grating coupler with the gradient refractive index may also help to reduce scattering artifacts and reflections at the interfaces between layers of different materials due to a smaller difference in the refractive indices.

Figure 16:
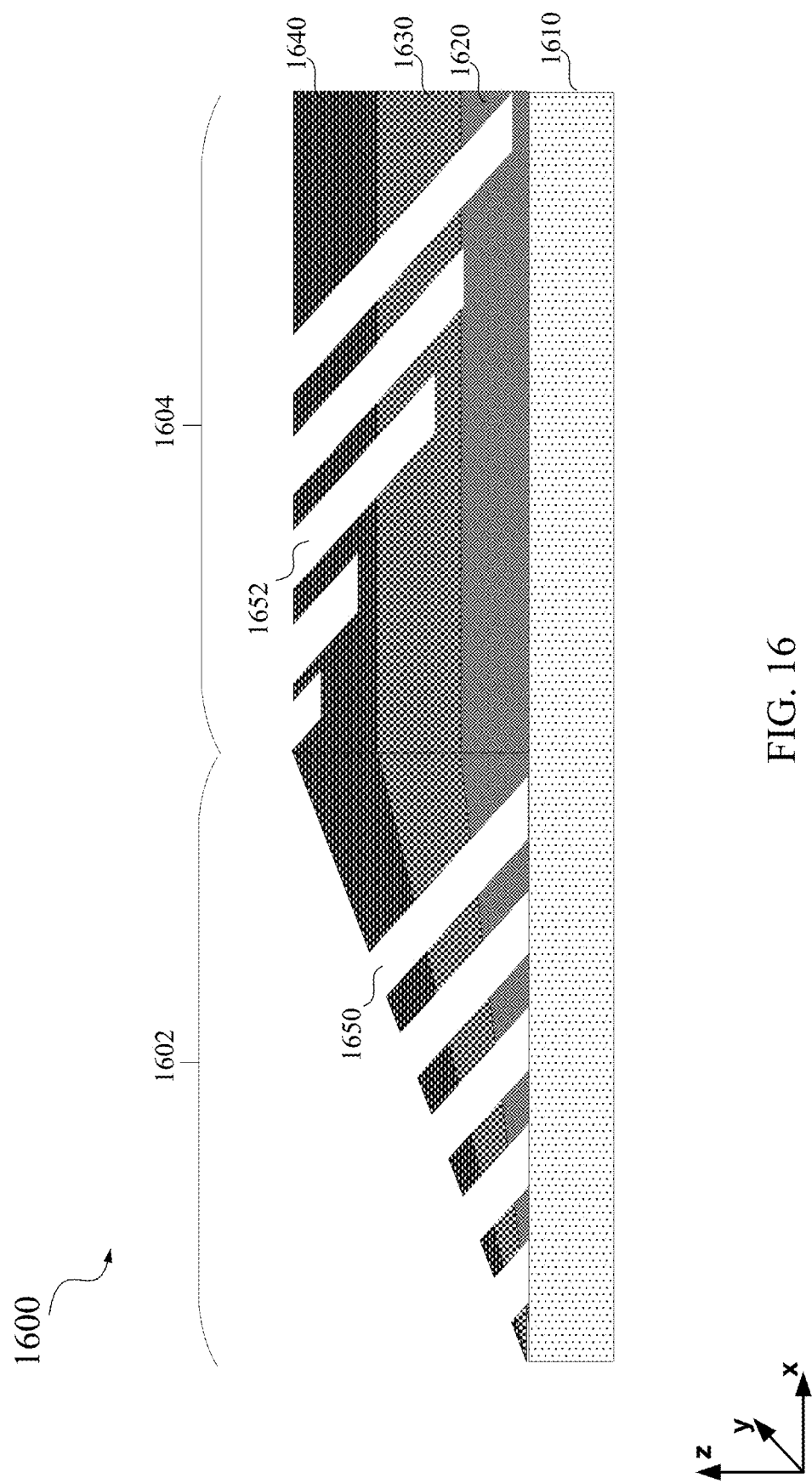
FIG. 16 illustrates examples of grating couplers in a waveguide display according to certain embodiments.

FIG. 16 illustrates an example of grating couplers with variable grating depths and variable refractive indices in a waveguide display 1600 according to certain embodiments. The grating couplers may include multiple grating layers, such as grating layers 1620, 1630, and 1640, formed on a substrate 1610 (e.g., a glass substrate). Grating layers 1620, 1630, and 1640 may be formed using the gray-tone lithography techniques described with respect to, for example, blocks 1310-1330 and FIGS. 14B and 14C. Even though three grating layers are shown in the example, the multiple grating layers may include two or more layers. As described above, the multiple grating layers may be characterized by different refractive indices. For example, in some embodiments, grating layer 1620 may have a refractive index greater than the refractive index of grating layer 1630, which may be greater than the refractive index of grating layer 1640. In some embodiments, grating layer 1620 may have a refractive index greater than the refractive index of grating layer 1630, while the refractive index of grating layer 1640 may be similar or equal to the refractive index of grating layer 1620. Each grating layer in grating layers 1620, 1630, and 1640 may have a non-uniform thickness profile, or may include regions with non-uniform thicknesses and regions with a uniform thickness. Grating layers 1620, 1630, and 1640 may be formed using techniques described with respect to, for example, blocks 1320 and 1330 and FIGS. 14B and 14C. The regions with non-uniform thicknesses and regions with a uniform thickness may be simultaneously formed in a same process or may be formed sequentially in different processes.

In the example shown in FIG. 16, slanted grating couplers may be formed in different regions using different processes, such as the gray-tone-first technique, the gray-tone-last technique, or a combination of the gray-tone-first technique and the gray-tone-last technique. For example, in a first region 1602, grating layers 1620, 1630, and 1640 may each have non-uniform thicknesses, and a plurality of grating grooves 1650 may be etched in grating layers 1620, 1630, and 1640 using substrate 1610 as the etch stop layer in a gray-tone-first process. In a second region 1604, grating layers 1620, 1630, and 1640 may each have a uniform thickness, and a plurality of grating grooves 1652 may be etched in grating layers 1620, 1630, and 1640 using a gray-tone etch mask that has a non-uniform thickness profile in a gray-tone-last process. The etching may be slanted etching, such as slanted ion or plasma etching (e.g., IBE, PE, or RIE), such that grating grooves 1650 and 1652 may be slanted to form a slanted grating. As described above, in some embodiments, an overcoat layer with a desired refractive index may be formed on the grating couplers to fill grating grooves 1650 and 1652.

Figure 17:
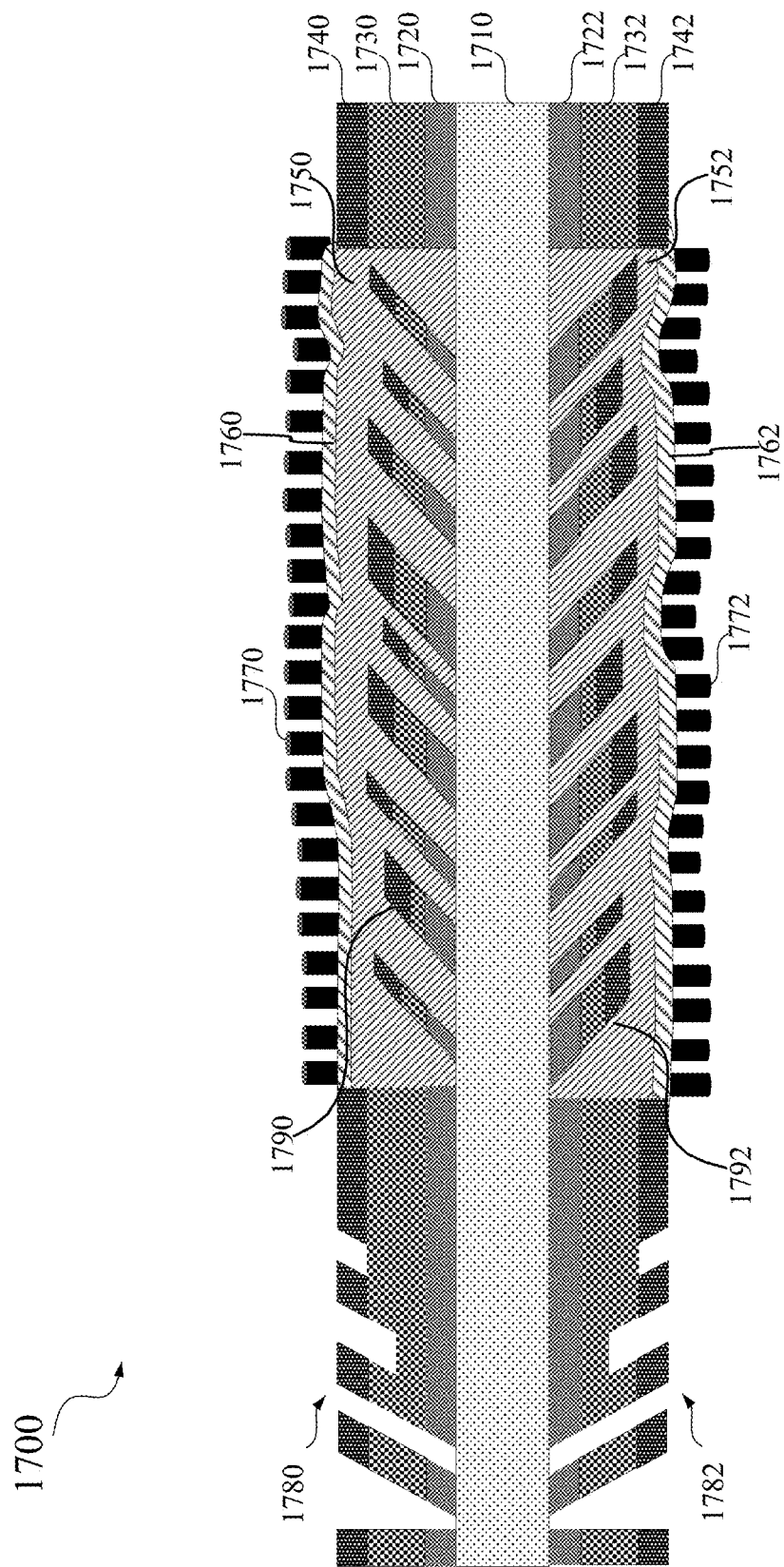
FIG. 17 illustrates an example of a waveguide display including grating couplers with variable grating depths and variable refractive indices according to certain embodiments.

FIG. 17 illustrates an example of a waveguide display 1700 including grating couplers with variable grating depths and variable refractive indices according to certain embodiments. Waveguide display 1700 may include a substrate 1710, such as substrate 420, 1010, or 1410. In the illustrated example, waveguide display 1700 may include input and output grating couplers on both sides of substrate 1710. The input and output grating couplers may be etched in one or more grating material layers formed on substrate 1710, such as grating material layers 1720, 1730, and 1740 formed on the top side of substrate 1710 and grating material layers 1722, 1732, and 1742 formed on the bottom side of substrate 1710. The grating material layers may be formed using the gray-tone lithography techniques described with respect to, for example, blocks 1310-1330 and FIGS. 14B and 14C. Even though three grating layers are shown on each side of substrate 1710 in the illustrated example, the grating material layers may include one or more grating material layers, such as less than three grating material layers or more than three grating material layers. The multiple grating material layers may be characterized by different refractive indices. For example, the multiple grating layers may have decreasing or increasing refractive indices. As described above with respect to FIG. 16, each grating material layer in the grating material layers may have a non-uniform thickness profile, or may have regions with non-uniform thicknesses and regions with a uniform thickness. For each grating material layer in the grating material layers, the regions with non-uniform thicknesses and regions with a uniform thickness may be simultaneously formed in a same process or may be formed sequentially in different processes.

As illustrated, waveguide display 1700 may include an input grating coupler 1780 and an output grating coupler 1790 on the top side of substrate 1710, and an input grating coupler 1782 and an output grating coupler 1792 on the bottom side of substrate 1710. The grating couplers may include vertical or slanted surface-relief gratings, with or without an overcoat layer. The grating couplers may have variable etch depths. In some embodiments, the grating couplers may also have variable grating periods, variable duty cycles, and/or variable slanted angles.

Input grating coupler 1780 and input grating coupler 1782 may be used to couple display light into substrate 1710 as described above with respect to FIG. 4 and FIG. 15B. For example, input grating coupler 1780 may have a diffraction efficiency less than 100%, and the undiffracted display light may be diffracted (e.g., reflectively diffracted) by input grating coupler 1782. In some embodiments, input grating coupler 1780 and input grating coupler 1782 may be used to couple display light of different colors and/or from different fields of view into substrate 1710. In the example shown in FIG. 17, input grating coupler 1780 may be formed in a region where each grating material layer of grating material layers 1720-1740 may have a different respective uniform thickness and a different respective material or composition (and thus a different respective refractive index). Input grating coupler 1780 may be formed using the gray-tone-last process or a combination of the gray-tone-first process and the gray-tone-last process. Input grating coupler 1782 may be formed in a similar manner. Although not shown in FIG. 17, an overcoat layer may be formed on each of input grating coupler 1780 and input grating coupler 1782.

Output grating coupler 1790 and output grating coupler 1792 may be used to couple display light out of substrate 1710 and toward user's eyes as described above with respect to, for example, FIG. 4 and FIG. 15B. Output grating coupler 1790 and output grating coupler 1792 may couple different portions of the display light, such as different fractions of the total intensity, different color components, and/or light for different fields of view, out of substrate 1710. In the example shown in FIG. 17, output grating coupler 1790 may be formed in a region where each grating material layer of grating material layers 1720-1740 may have a respective non-uniform thickness and a different respective material or composition (and thus a different respective refractive index). Output grating coupler 1790 may be formed using the gray-tone-first process or a combination of the gray-tone-first process and the gray-tone-last process described above. For example, output grating coupler 1790 may be etched through grating material layers 1720-1740, using substrate 1710 as the etch stop layer. Due to the non-uniform thicknesses of grating material layers 1720-1740, output grating coupler 1790 may have a variable etch depth. Output grating coupler 1790 may alternatively be etched in grating material layers 1720-1740 using a gray-tone photoresist layer that has a certain thickness profile as the etch mask for transferring the thickness profile into grating material layers 1720-1740. Output grating coupler 1792 may be fabricated in a similar manner.

An overcoat layer 1750 and an overcoat layer 1752 may be formed on output grating coupler 1790 and output grating coupler 1792, respectively. As described above, the overcoat layer may include a material having a refractive index that is higher or lower than the refractive indices of grating material layers 1720-1740. A buffer layer 1760 may be formed on overcoat layer 1750. A layer 1770 may be formed on buffer layer 1760. Layer 1770 may be an anti-reflection coating layer that may reduce the reflection of visible light at the top surface of substrate 1710, including display light entering or exiting substrate 1710 and ambient light for the see-through view. In some embodiments, layer 1770 may be an angular selective transmission layer, where ambient light from grazing angles outside of the see-through field of view of waveguide display 1700 may be blocked such that it would not enter the grating couplers to cause certain optical artifacts, such as rainbow images described above. Layer 1770 may work for light in a broad wavelength range and a large angular range. In one example, layer 1770 may include a grating with a very small grating period such that visible light diffracted by layer 1770 may have a large diffraction angle and thus may not reach user's eyes. Due to the small grating period, layer 1770 may not result in see-through haze. A buffer layer 1762 and a layer 1772 may be formed on overcoat layer 1752 and may be similar to buffer layer 1760 and layer 1770, respectively.

As shown in, for example, FIG. 17, due to the non-uniform thicknesses of grating material layers 1720-1740, the top surface of overcoat layer 1750 or 1752 may not be flat either because the coated material may follow the topography of the underlying output grating coupler 1790, which may have varying grating parameters, such as depths, slant angles, duty cycles, grating periods, and the like. For example, the top surface of overcoat layer 1750 at a region of output grating coupler 1790 having a lower thickness may be lower than the top surface of overcoat layer 1750 at a region of output grating coupler 1790 having a higher thickness. Due to the uneven top surface of overcoat layer 1750, it may be difficult to manufacture other devices or components, such as layer 1770, on overcoat layer 1750. Chemical-mechanical polishing techniques may be used to achieve a flat top surface on overcoat layer 1750, but may not precisely control the thickness of overcoat layer 1750 on top of the slanted output grating coupler 1790.

According to certain embodiments, a gray-tone photoresist layer may be coated on the overcoat layer using, for example, the spin-on coating technique. A gray-tone lithography process as described above may then be performed using a gray-scale photomask with the light transmissivity corresponding to the overcoat layer topography to create a planar top surface on the gray-tone photoresist layer after the exposure and development. The gray-tone photoresist layer may have an etch rate similar or comparable to an etch rate of the overcoat layer such that the gray-tone photoresist layer and the underlying overcoat layer may be etched in an etching process to leave a flat top on the overcoat layer. The etch rate and etch time may be controlled to control the thickness of the overcoat burden.

FIGS. 18A-18F illustrate an example of a process for manufacturing a grating with an overcoat layer having a flat top according to certain embodiments. FIG. 18A shows a grating layer 1820 on a substrate 1810. Grating layer 1820 may include a surface-relief grating 1822 formed therein, where surface-relief grating 1822 may have a variable etch depth or a variable thickness. As described above, surface-relief grating 1822 may also have a variable grating period and/or a variable duty cycle.

FIG. 18B shows an overcoat layer 1830 coated on grating layer 1820. Overcoat layer 1830 may have an uneven top surface due to the non-uniformity of the underlying surface-relief grating 1822. For example, in regions where the etch depth is higher, the top surface of overcoat layer 1830 may be lower because the deeper grating grooves may accept more overcoat materials.

FIG. 18C shows a gray-tone photoresist layer 1840 coated on overcoat layer 1830. As described above, gray-tone photoresist layer 1840 may include a low contrast photoresist material that has a linear or other non-binary response to exposure dosage. In some embodiments, the photoresist material may be sensitive to light with a wavelength shorter than about 300 nm. In some embodiments, the photoresist material may be characterized by an etch rate that is between about 0.5 and about 5 times of an etch rate of overcoat layer 1830. In some embodiments, the photoresist material may be characterized by a linear response to UV light dose such that a depth of an exposed portion of the photoresist material is a linear function of the UV light dose. The photoresist material may include a positive-tone photoresist material. In some embodiments, the photoresist material layer may include, for example, PMMA sensitized with a photosensitive group. The photosensitive group may include at least one of an acyloximino group, methacrylonitrile, terpolymer of methyl methacrylate, oximino methacrylate, benzoic acids, N-acetylcarbazole, or indenone. In some embodiments, the photoresist material layer may include at least one of poly(methyl methacrylate)-r-poly(tert-butyl methacrylate)-r-poly(methyl methacrylate) and a photo acid generator, poly(methyl methacrylate)-r-poly(methacrylic acid), poly(α-methylstyrene-co-methyl chloroacrylate) and an acid generator, polycarbonate and a photo acid or base generator, polylactide and a photo acid or base generator, or polyphthalaldehyde and a photo acid generator. Gray-tone photoresist layer 1840 may be formed on overcoat layer 1830 by, for example, spin coating or spray coating. As illustrated in FIG. 18C, gray-tone photoresist layer 1840 may have an uneven top surface due to the uneven top surface of the underlying overcoat layer 1830.

FIG. 18D shows a photolithography process, where gray-tone photoresist layer 1840 may be exposed to a non-uniform light pattern 1860 for a certain period of time. The intensity of non-uniform light pattern 1860 may correspond to the surface topology of gray-tone photoresist layer 1840. For example, in regions where the top surface of gray-tone photoresist layer 1840 is higher, the intensity of non-uniform light pattern 1860 may be higher such that the exposed portion may have a higher depth. In regions where the top surface of gray-tone photoresist layer 1840 is lower, the intensity of non-uniform light pattern 1860 may be lower such that the exposed portion may have a lower depth. As such, the interface between the exposed portion and the unexposed portion of gray-tone photoresist layer 1840 may be approximately flat. Non-uniform light pattern 1860 may be generated, for example, using a collimated beam with a uniform intensity and a gray-scale photomask 1850 that has a transmissivity corresponding to the desired intensity of non-uniform light pattern 1860. In one embodiment, the topology of gray-tone photoresist layer 1840 may be measured and the transmissivity of gray-scale photomask 1850 may be determined based on the measured topology of gray-tone photoresist layer 1840.

FIG. 18E shows the gray-tone photoresist layer 1840 after exposure and development. As described above, due to the different exposure dosages and thus different exposure depths at the different regions of gray-tone photoresist layer 1840, the top surface of the unexposed portion 1842 of gray-tone photoresist layer 1840 may be approximately flat. In some embodiments, the unexposed portion 1842 of gray-tone photoresist layer 1840 may be cured (e.g., using UV light or heat) to desensitize the photosensitive photoresist material.

FIG. 18F shows that a uniform etching process may be performed to uniformly etch gray-tone photoresist layer 1840 and overcoat layer 1830. The parameters of the etching process, such as the etch rate and etch time, can be set such that gray-tone photoresist layer 1840 may be completely removed and the remaining portion 1832 of overcoat layer 1830 may have a desired thickness. Due to the uniform etch rate, the resultant top surface of the remaining portion 1832 of overcoat layer 1830 may be approximately flat. As such, it can be easier to fabricate other devices or components, such as an anti-reflection coating layer or an angular selective transmission layer described with respect to FIG. 17, on the flat top surface of overcoat layer 1830.

FIGS. 19A-19D illustrate an example of a method of controlling the height profile and grating region of a grating using gray-tone lithography according to certain embodiments. In some embodiments, it may be desirable to prevent some regions of a grating layer from being etched. For example, as shown in FIG. 17, certain regions of waveguide display 1700 may not need to have grating structures. In some embodiments, it may be desirable to keep certain regions of the grating layer at a certain height different from surrounding regions, for example, for use as an alignment mark or for improving the optical modulation transfer function (MTF) of the grating. The alignment mark may be used, for example, for mask alignment in subsequent processes or for alignment during assembly. According to certain embodiments, gray-tone lithography may be used to define the etch regions and the block regions, or to control the thicknesses in different regions of the grating layer. For example, a thick photoresist layer may be formed in regions where etching is not needed to prevent the regions from being etched.

FIG. 19A shows that a grating material layer 1920 is formed on a substrate 1910. A hard mask 1930 may be formed on a region of grating material layer 1920 as described above with respect to, for example, FIGS. 10B-10D. FIG. 19B shows that a gray-tone photoresist layer 1940 may be formed on hard mask 1930 and grating material layer 1920, and may be patterned using the gray-tone photolithography process described above. In the illustrated example, a region 1942 of gray-tone photoresist layer 1940 may have a uniform and high thickness, whereas a region 1944 of gray-tone photoresist layer 1940 on hard mask 1930 may have a variable thickness. A slanted etching process may then be performed to etch grating material layer 1920 using gray-tone photoresist layer 1940 and hard mask 1930.

FIG. 19C shows that region 1944 of gray-tone photoresist layer 1940 has been etched completely, while region 1942 of gray-tone photoresist layer 1940 may have not been completely etched. A plurality of grating grooves may be formed in grating material layer 1920. After the etching, hard mask 1930 may be stripped. FIG. 19D shows that region 1942 of gray-tone photoresist layer 1940 and grating material layer 1920 may be further etched (e.g., vertically etched) to remove a region 1926 of grating material layer 1920, such that the top surface of a region 1924 of grating material layer 1920 may be higher than the top surface of other regions of grating material layer 1920. In some embodiments, region 1942 of gray-tone photoresist layer 1940 may have a non-uniform thickness to form a certain pattern, such as a registration feature (e.g., a cross) for alignment, in region 1924 of grating material layer 1920.

Figure 20:
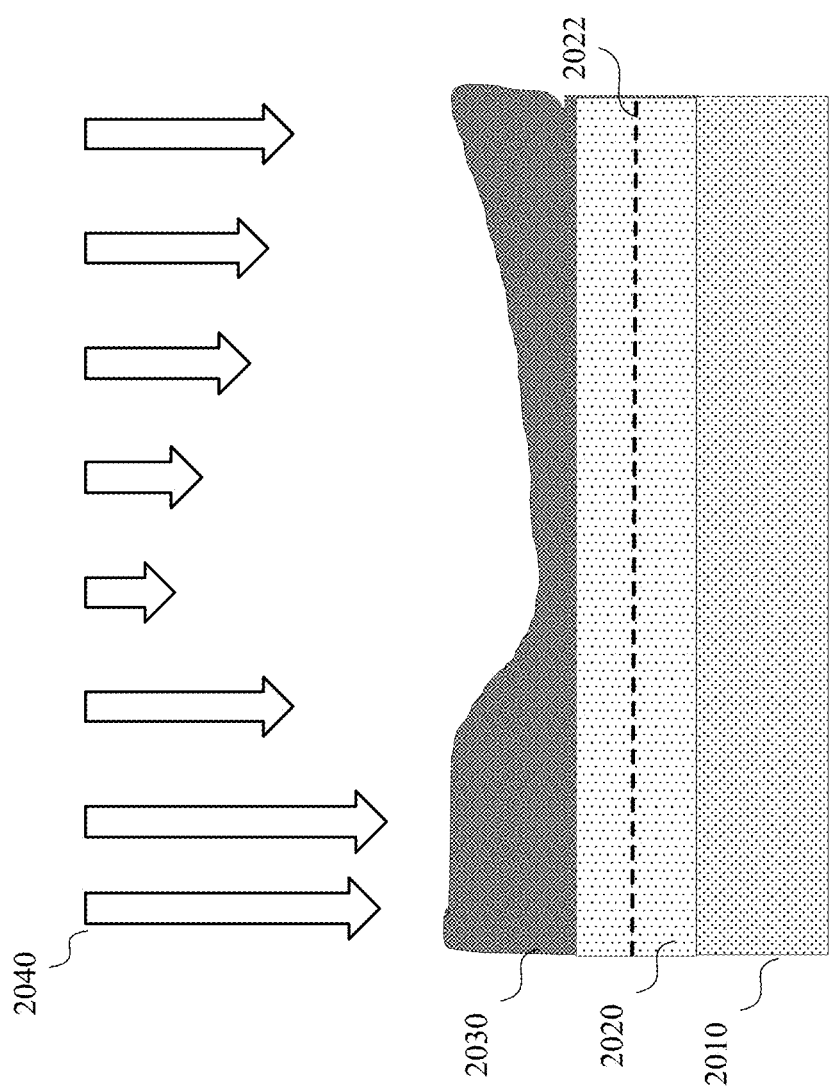
FIG. 20 illustrates an example of a method of compensating for non-uniform etch rates of an etching process using gray-tone lithography according to certain embodiments.

FIG. 20 illustrates an example of a method of compensating for non-uniform etch rates of an etching process using gray-tone lithography according to certain embodiments. In some etching systems, such as etch systems that may have a large etch area (e.g., for wafer-level etching), the etch rates at different regions may be different. For example, the etch rate may be high at the center of the etch area, and may be low at the edge of the etch area. In the illustrated example, a film 2020 formed on a substrate 2010 may need to be etched. The etch rate of the etching system is shown by a pattern 2040, which shows that the etch rate may not be uniform across the entire etch area. The non-uniform etch rate may be measured and used to generate a gray-scale photomask.

To compensate for the non-uniform etch rate, a uniform layer of a gray-tone photoresist layer 2030 may be formed on film 2020. As described above, gray-tone photoresist layer 2030 may have a linear or another non-binary response to exposure dosage and may have an etch rate comparable to the etch rate of film 2020. Gray-tone photoresist layer 2030 may be exposed to a light beam with a uniform intensity through a gray-scale photomask having a transmissivity complementary to the measured etch rate of the etching system. After the exposure and the development processes, the remaining gray-tone photoresist layer 2030 in an area with a higher etch rate may have a higher thickness due to a lower exposure dosage, while the remaining gray-tone photoresist layer 2030 in an area with a lower etch rate may have a lower thickness due to the higher exposure dosage.

Gray-tone photoresist layer 2030 with an uneven thickness and film 2020 may then be etched using the etching system that has the etch rate shown by pattern 2040. A uniform etch depth as shown by a line 2022 in film 2020 may be achieved after a certain etch period as a result of the combination of the uneven thickness profile of gray-tone photoresist layer 2030 and the uneven etch rates in different regions of the etch area.

Embodiments of the invention may include or be implemented in conjunction with an artificial reality system. Artificial reality is a form of reality that has been adjusted in some manner before presentation to a user, which may include, for example, a virtual reality, an augmented reality, a mixed reality, a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

Figure 21:
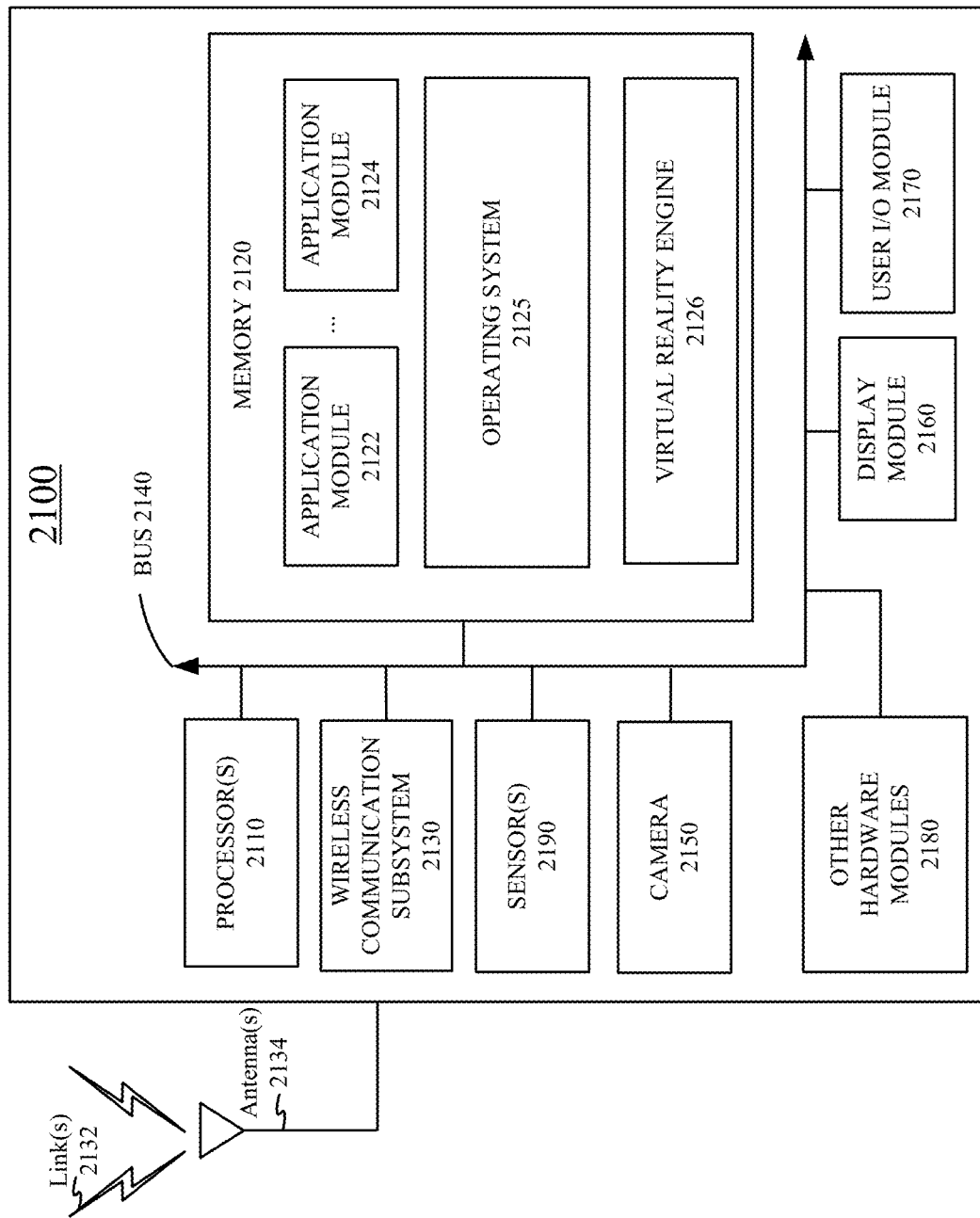
FIG. 21 is a simplified block diagram of an example electronic system of an example near-eye display for implementing some of the examples disclosed herein.

FIG. 21 is a simplified block diagram of an example electronic system 2100 of an example near-eye display (e.g., HMD device) for implementing some of the examples disclosed herein. Electronic system 2100 may be used as the electronic system of an HMD device or other near-eye displays described above. In this example, electronic system 2100 may include one or more processor(s) 2110 and a memory 2120. Processor(s) 2110 may be configured to execute instructions for performing operations at a number of components, and can be, for example, a general-purpose processor or microprocessor suitable for implementation within a portable electronic device. Processor(s) 2110 may be communicatively coupled with a plurality of components within electronic system 2100. To realize this communicative coupling, processor(s) 2110 may communicate with the other illustrated components across a bus 2140. Bus 2140 may be any subsystem adapted to transfer data within electronic system 2100. Bus 2140 may include a plurality of computer buses and additional circuitry to transfer data.

Memory 2120 may be coupled to processor(s) 2110. In some embodiments, memory 2120 may offer both short-term and long-term storage and may be divided into several units. Memory 2120 may be volatile, such as static random access memory (SRAM) and/or DRAM and/or non-volatile, such as read-only memory (ROM), flash memory, and the like. Furthermore, memory 2120 may include removable storage devices, such as secure digital (SD) cards. Memory 2120 may provide storage of computer-readable instructions, data structures, program modules, and other data for electronic system 2100. In some embodiments, memory 2120 may be distributed into different hardware modules. A set of instructions and/or code might be stored on memory 2120. The instructions might take the form of executable code that may be executable by electronic system 2100, and/or might take the form of source and/or installable code, which, upon compilation and/or installation on electronic system 2100 (e.g., using any of a variety of generally available compilers, installation programs, compression/decompression utilities, etc.), may take the form of executable code.

In some embodiments, memory 2120 may store a plurality of application modules 2122 through 2124, which may include any number of applications. Examples of applications may include gaming applications, conferencing applications, video playback applications, or other suitable applications. The applications may include a depth sensing function or eye tracking function. Application modules 2122-2124 may include particular instructions to be executed by processor(s) 2110. In some embodiments, certain applications or parts of application modules 2122-2124 may be executable by other hardware modules 2180. In certain embodiments, memory 2120 may additionally include secure memory, which may include additional security controls to prevent copying or other unauthorized access to secure information.

In some embodiments, memory 2120 may include an operating system 2125 loaded therein. Operating system 2125 may be operable to initiate the execution of the instructions provided by application modules 2122-2124 and/or manage other hardware modules 2180 as well as interfaces with a wireless communication subsystem 2130 which may include one or more wireless transceivers. Operating system 2125 may be adapted to perform other operations across the components of electronic system 2100 including threading, resource management, data storage control and other similar functionality.

Wireless communication subsystem 2130 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 2100 may include one or more antennas 2134 for wireless communication as part of wireless communication subsystem 2130 or as a separate component coupled to any portion of the system. Depending on desired functionality, wireless communication subsystem 2130 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 2130 may permit data to be exchanged with a network, other computer systems, and/or any other devices described herein. Wireless communication subsystem 2130 may include a means for transmitting or receiving data, such as identifiers of HMD devices, position data, a geographic map, a heat map, photos, or videos, using antenna(s) 2134 and wireless link(s) 2132. Wireless communication subsystem 2130, processor(s) 2110, and memory 2120 may together comprise at least a part of one or more of a means for performing some functions disclosed herein.

Embodiments of electronic system 2100 may also include one or more sensors 2190. Sensor(s) 2190 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 2190 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or some combination thereof. The position sensors may be located external to the IMU, internal to the IMU, or some combination thereof. At least some sensors may use a structured light pattern for sensing.

Electronic system 2100 may include a display module 2160. Display module 2160 may be a near-eye display, and may graphically present information, such as images, videos, and various instructions, from electronic system 2100 to a user. Such information may be derived from one or more application modules 2122-2124, virtual reality engine 2126, one or more other hardware modules 2180, a combination thereof, or any other suitable means for resolving graphical content for the user (e.g., by operating system 2125). Display module 2160 may use liquid crystal display (LCD) technology, LED technology (including, for example, OLED, ILED, µLED, AMOLED, TOLED, etc.), light emitting polymer display (LPD) technology, or some other display technology.

Electronic system 2100 may include a user input/output module 2170. User input/output module 2170 may allow a user to send action requests to electronic system 2100. An action request may be a request to perform a particular action. For example, an action request may be to start or end an application or to perform a particular action within the application. User input/output module 2170 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 2100. In some embodiments, user input/output module 2170 may provide haptic feedback to the user in accordance with instructions received from electronic system 2100. For example, the haptic feedback may be provided when an action request is received or has been performed.

Electronic system 2100 may include a camera 2150 that may be used to take photos or videos of a user, for example, for tracking the user's eye position. Camera 2150 may also be used to take photos or videos of the environment, for example, for VR, AR, or MR applications. Camera 2150 may include, for example, a complementary metal-oxide-semiconductor (CMOS) image sensor with a few millions or tens of millions of pixels. In some implementations, camera 2150 may include two or more cameras that may be used to capture 3D images.

In some embodiments, electronic system 2100 may include a plurality of other hardware modules 2180. Each of other hardware modules 2180 may be a physical module within electronic system 2100. While each of other hardware modules 2180 may be permanently configured as a structure, some of other hardware modules 2180 may be temporarily configured to perform specific functions or temporarily activated. Examples of other hardware modules 2180 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 2180 may be implemented in software.

In some embodiments, memory 2120 of electronic system 2100 may also store a virtual reality engine 2126. Virtual reality engine 2126 may execute applications within electronic system 2100 and receive position information, acceleration information, velocity information, predicted future positions, or some combination thereof of the HMD device from the various sensors. In some embodiments, the information received by virtual reality engine 2126 may be used for producing a signal (e.g., display instructions) to display module 2160. For example, if the received information indicates that the user has looked to the left, virtual reality engine 2126 may generate content for the HMD device that mirrors the user's movement in a virtual environment. Additionally, virtual reality engine 2126 may perform an action within an application in response to an action request received from user input/output module 2170 and provide feedback to the user. The provided feedback may be visual, audible, or haptic feedback. In some implementations, processor(s) 2110 may include one or more graphic processing units (GPUs) that may execute virtual reality engine 2126.

In various implementations, the above-described hardware and modules may be implemented on a single device or on multiple devices that can communicate with one another using wired or wireless connections. For example, in some implementations, some components or modules, such as GPUs, virtual reality engine 2126, and applications (e.g., tracking application), may be implemented on a console separate from the head-mounted display device. In some implementations, one console may be connected to or support more than one HMD.

In alternative configurations, different and/or additional components may be included in electronic system 2100. Similarly, functionality of one or more of the components can be distributed among the components in a manner different from the manner described above. For example, in some embodiments, electronic system 2100 may be modified to include other system environments, such as an AR system environment and/or an MR environment.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium," as used herein, refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A method comprising:
   receiving a substrate including a surface-relief grating formed thereon;
   depositing an overcoat layer on the surface-relief grating to fill grating grooves of the surface-relief grating and cover top surfaces of grating ridges of the surface-relief grating, the overcoat layer having an uneven top surface;

depositing a gray-tone photoresist layer on the overcoat layer, the gray-tone photoresist layer characterized by an uneven top surface;

exposing, through a gray-scale photomask, the gray-tone photoresist layer to a light beam having a non-uniform intensity;

developing the gray-tone photoresist layer to remove exposed portions of the gray-tone photoresist layer; and fully etching the gray-tone photoresist layer and partially etching the overcoat layer to form an even top surface at the overcoat layer.

2. The method of claim 1, wherein the surface-relief grating is characterized by at least one of:
a variable etch depth;
a variable grating period;
a variable duty cycle;
a variable thickness; or
an uneven top surface.

3. The method of claim 1, wherein the gray-scale photomask is characterized by a transmissivity profile corresponding to a height profile of the uneven top surface of the gray-tone photoresist layer.

4. The method of claim 1, wherein an etch rate of the gray-tone photoresist layer is between 0.5 and 5 times of an etch rate of the overcoat layer during the etching.

5. The method of claim 1, wherein the gray-tone photoresist layer is characterized by a non-binary response to exposure dosage such that a depth of an exposed portion of the gray-tone photoresist layer is a function of the exposure dosage.

6. The method of claim 1, wherein the gray-tone photoresist layer is sensitive to light having a wavelength shorter than 300 nm, 250 nm, 193 nm, or 157 nm.

7. The method of claim 1, wherein the gray-tone photoresist layer is characterized by an even top surface after the developing.

8. The method of claim 1, further comprising forming an anti-reflection coating layer or an angular selective transmission layer on the overcoat layer.

9. The method of claim 1, wherein etching the gray-tone photoresist layer and the overcoat layer includes etching the gray-tone photoresist layer and the overcoat layer using at least one of:
an oxygen source including $O_2$, $N_2O$, $CO_2$, or CO;
a nitrogen source including $N_2$, $N_2O$, or $NH_3$; or
ions with an energy between 100 and 500 eV.

10. A method comprising:
depositing a grating material layer on a substrate;
forming a patterned hard mask on a first area of the grating material layer but not on a second area of the grating material layer;
depositing a photoresist material layer on the patterned hard mask and the second area of the grating material layer, the photoresist material layer sensitive to exposure light and having a non-binary response to exposure dosage;
exposing the photoresist material layer on the patterned hard mask to a light beam for a period of time, the light beam characterized by a non-uniform light intensity;
developing the photoresist material layer to remove portions of the photoresist material layer exposed to the light beam;
etching the photoresist material layer and the grating material layer to form a grating with a variable depth in the grating material layer, wherein a portion of the photoresist material layer remains on the second area of the grating material layer;
removing the patterned hard mask on the first area of the grating material layer; and
etching, after removing the patterned hard mask, the first area of the grating material layer and the portion of the photoresist material layer on the second area of the grating material layer without using any etch mask.

11. The method of claim 10, wherein an etch rate of the photoresist material layer is between 0.5 and 5 times of an etch rate of the grating material layer.

12. The method of claim 10, wherein the light beam includes an ultraviolet light beam.

13. The method of claim 10, further comprising:
exposing the photoresist material layer on the second area of the grating material layer to a light pattern corresponding to an alignment mark,
wherein etching the first area of the grating material layer and the photoresist material layer on the second area of the grating material layer forms the alignment mark in the second area of the grating material layer.

14. The method of claim 10, further comprising, after developing the photoresist material layer, curing the photoresist material layer using heat or ultraviolet light.

15. The method of claim 10, wherein etching the photoresist material layer and the grating material layer includes etching the photoresist material layer and the grating material layer using at least one of:
an oxygen source including $O_2$, $N_2O$, $CO_2$, or CO;
a nitrogen source including $N_2$, $N_2O$, or $NH_3$; or
ions with an energy between 100 and 500 eV.

16. A method comprising:
depositing a gray-tone photoresist layer on a material layer to be etched by an etching system, wherein the etching system is characterized by an uneven etch rate in an etch area;
exposing, through a gray-scale photomask, the gray-tone photoresist layer to a light beam having a non-uniform intensity, wherein a transmissivity of the gray-scale photomask is determined based on the uneven etch rate of the etching system;
developing the gray-tone photoresist layer to remove exposed portions of the gray-tone photoresist layer, wherein remaining portions of the gray-tone photoresist layer have an uneven top surface; and
etching the remaining portions of the gray-tone photoresist layer and the material layer to be etched for a period of time to remove materials of the material layer uniformly across the material layer.

17. The method of claim 16, wherein an etch rate of the gray-tone photoresist layer is between 0.5 and 5 times of an etch rate of the material layer to be etched.

18. The method of claim 16, wherein the light beam includes an ultraviolet beam.

19. The method of claim 16, further comprising, after developing the gray-tone photoresist layer, curing the gray-tone photoresist layer.

20. The method of claim 16, wherein the transmissivity of the gray-scale photomask is complementary to the uneven etch rate of the etching system.

* * * * *